United States Patent
Hurwitz et al.

(10) Patent No.: US 10,014,843 B2
(45) Date of Patent: Jul. 3, 2018

(54) MULTILAYER ELECTRONIC STRUCTURES WITH EMBEDDED FILTERS

(71) Applicant: Zhuhai Advanced Chip Carriers & Electronic Substrate Solutions Technologies Co. Ltd., Zhuhai (CN)

(72) Inventors: Dror Hurwitz, Zhuhai (CN); Alex Huang, Zhuhai (CN)

(73) Assignee: Zhuhai Advanced Chip Carriers & Electronic Substrate Solutions Technologies Co. Ltd., Zhuhai (CN)

( * ) Notice: Subject to any disclaimer, the term of this patent is extended or adjusted under 35 U.S.C. 154(b) by 0 days.

(21) Appl. No.: 13/962,316

(22) Filed: Aug. 8, 2013

(65) Prior Publication Data

US 2015/0042415 A1 Feb. 12, 2015

(51) Int. Cl.
| | |
|---|---|
| *H03H 7/01* | (2006.01) |
| *H03H 3/00* | (2006.01) |
| *H01L 27/01* | (2006.01) |
| *H03H 1/00* | (2006.01) |
| *H01L 49/02* | (2006.01) |

(52) U.S. Cl.
CPC ......... *H03H 7/0138* (2013.01); *H01L 27/016* (2013.01); *H03H 3/00* (2013.01); *H03H 7/0115* (2013.01); *H01L 28/10* (2013.01); *H01L 28/60* (2013.01); *H03H 2001/0085* (2013.01)

(58) Field of Classification Search
CPC .......... H03H 1/00; H03H 1/0007; H03H 1/02; H03H 2001/0014; H03H 2001/0021; H03H 2001/0028; H03H 2001/0042; H03H 2001/005; H03H 2001/0064; H03H 2001/0071; H03H 2001/0078; H03H 2001/0085; H03H 2001/0092
See application file for complete search history.

(56) References Cited

U.S. PATENT DOCUMENTS

| | | | | | |
|---|---|---|---|---|---|
| 3,720,862 | A | * | 3/1973 | Mason | C03C 3/074 361/320 |
| 4,872,739 | A | * | 10/1989 | Kahn | G02B 6/2817 250/227.31 |
| 5,055,966 | A | * | 10/1991 | Smith et al. | 361/321.3 |
| 5,366,920 | A | * | 11/1994 | Yamamichi | H01L 28/40 216/6 |

(Continued)

FOREIGN PATENT DOCUMENTS

| | | |
|---|---|---|
| JP | 2007295007 | 10/2000 |
| JP | 2002368428 | 12/2002 |

(Continued)

*Primary Examiner* — Thomas J Hiltunen
(74) *Attorney, Agent, or Firm* — Wiggin and Dana LLP; Gregory S. Rosenblatt; Andrew D. Bochner

(57) ABSTRACT

A composite electronic structure comprising at least one feature layer and at least one adjacent via layer, said layers extending in an X-Y plane and having height z, wherein the structure comprises at least one capacitor coupled in series or parallel to at least one inductor to provide at least one filter;
the at least one capacitor being sandwiched between the at least one feature layer and at least one via in said at least one adjacent via layer, such that the at least one via stands on the at least one capacitor, and the at least one of the first feature layer and the adjacent via layer includes at least one inductor extending in the XY plane.

24 Claims, 27 Drawing Sheets

(56) References Cited

U.S. PATENT DOCUMENTS

| | | | | |
|---|---|---|---|---|
| 5,603,847 A | * | 2/1997 | Howard et al. | 216/17 |
| 5,708,559 A | * | 1/1998 | Brabazon | H01L 28/40 257/301 |
| 5,879,985 A | * | 3/1999 | Gambino et al. | 438/253 |
| 5,886,597 A | * | 3/1999 | Riad | 333/245 |
| 6,091,310 A | * | 7/2000 | Utsumi et al. | 333/12 |
| 6,133,108 A | * | 10/2000 | New | H01L 28/55 257/E21.009 |
| 6,153,290 A | * | 11/2000 | Sunahara | 428/210 |
| 6,166,423 A | * | 12/2000 | Gambino | H01L 21/76807 257/532 |
| 6,278,153 B1 | * | 8/2001 | Kikuchi | H01L 28/55 257/295 |
| 6,351,880 B1 | * | 3/2002 | Palmer | H01L 23/5384 257/E23.174 |
| 6,395,633 B1 | * | 5/2002 | Cheng | H05K 3/4647 438/637 |
| 6,440,845 B1 | * | 8/2002 | Jou | H01L 23/5222 257/E21.011 |
| 6,542,053 B2 | * | 4/2003 | Yamaguchi | H03H 7/0115 333/177 |
| 6,621,012 B2 | * | 9/2003 | Crockett et al. | 174/261 |
| 6,680,542 B1 | * | 1/2004 | Gibson et al. | 257/774 |
| 6,803,641 B2 | * | 10/2004 | Papa Rao | H01L 27/0805 257/306 |
| 6,821,015 B2 | * | 11/2004 | Hammer | G01K 17/20 136/225 |
| 6,876,056 B2 | * | 4/2005 | Tilmans et al. | 257/528 |
| 7,005,721 B2 | * | 2/2006 | Nishijima | 257/531 |
| 7,095,124 B2 | * | 8/2006 | Hasunuma | H01L 23/293 257/750 |
| 7,132,984 B2 | * | 11/2006 | Kameda | H01Q 1/38 343/700 MS |
| 7,157,992 B2 | * | 1/2007 | McKinzie | 333/219 |
| 7,200,920 B2 | * | 4/2007 | Schuster | 29/610.1 |
| 7,208,832 B2 | | 4/2007 | Yamagata | |
| 7,211,495 B2 | * | 5/2007 | Park | 438/386 |
| 7,248,134 B2 | * | 7/2007 | Wu et al. | 333/246 |
| 7,268,645 B2 | * | 9/2007 | Meltzer et al. | 333/175 |
| 7,423,500 B2 | * | 9/2008 | Ishiwata | 333/172 |
| 7,519,328 B2 | * | 4/2009 | Dokai | G06K 19/07749 455/334 |
| 7,557,003 B2 | * | 7/2009 | Kim | H01L 21/76852 438/239 |
| 7,742,314 B2 | * | 6/2010 | Urashima et al. | 361/793 |
| 7,859,080 B2 | * | 12/2010 | Kuwajima | H01G 4/33 257/275 |
| 8,017,997 B2 | * | 9/2011 | Divakaruni et al. | 257/346 |
| 8,064,214 B2 | * | 11/2011 | Frasco | 361/763 |
| 8,405,135 B2 | * | 3/2013 | Yang | H01L 23/5223 257/301 |
| 9,349,788 B2 | * | 5/2016 | Hurwitz | H01L 28/65 |
| 9,601,545 B1 | * | 3/2017 | Tu | H01L 27/0805 |
| 2008/0157276 A1 | * | 7/2008 | Park | 257/532 |
| 2012/0257323 A1 | * | 10/2012 | Hayakawa | 361/301.4 |
| 2013/0335880 A1 | * | 12/2013 | Masuda | H01G 4/005 361/303 |
| 2014/0009866 A1 | * | 1/2014 | Masuda | H01G 4/005 361/306.1 |
| 2015/0042415 A1 | * | 2/2015 | Hurwitz | H03H 3/00 333/185 |
| 2015/0043126 A1 | * | 2/2015 | Hurwitz | H01L 28/65 361/303 |
| 2015/0228416 A1 | * | 8/2015 | Hurwitz | H01G 17/00 361/763 |
| 2017/0374747 A1 | * | 12/2017 | Hurwitz | H01L 24/17 |

FOREIGN PATENT DOCUMENTS

| | | |
|---|---|---|
| JP | 2004274267 | 9/2004 |
| JP | 2007220943 | 8/2007 |

* cited by examiner

Fig. 8(iii)

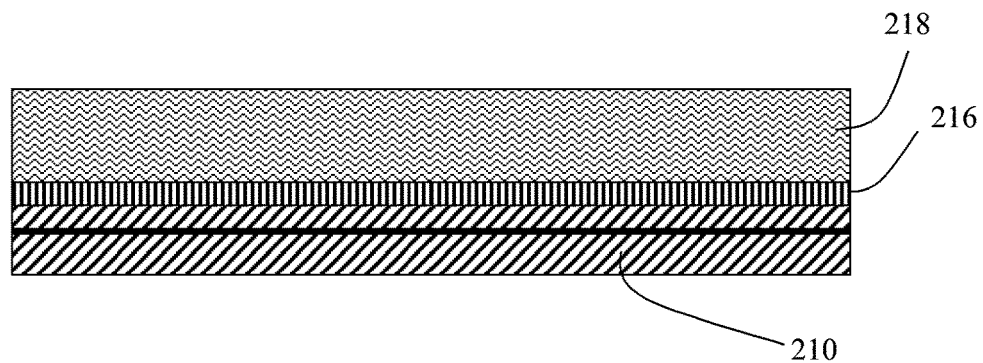
Fig. 8(vi)
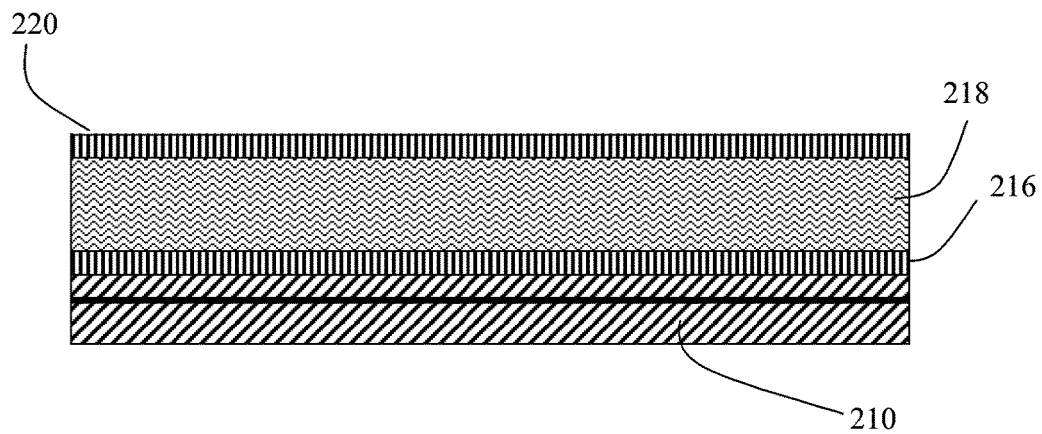
Fig. 8(vii)
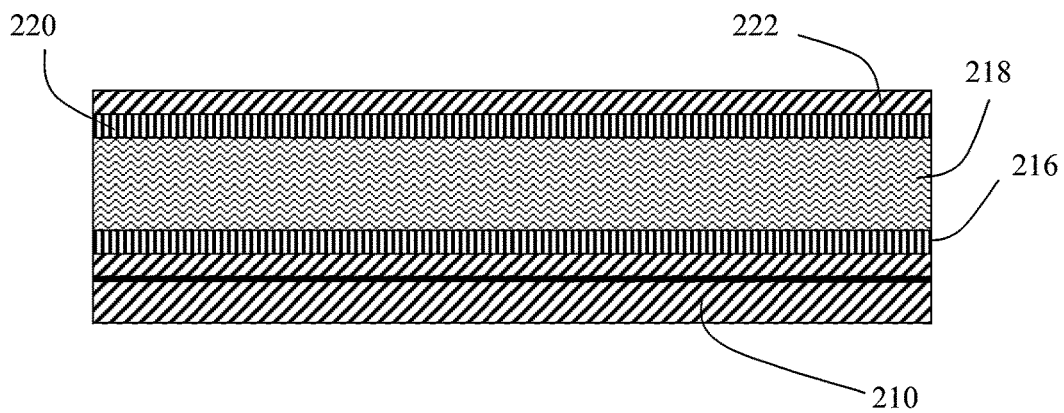
Fig. 8(viii)

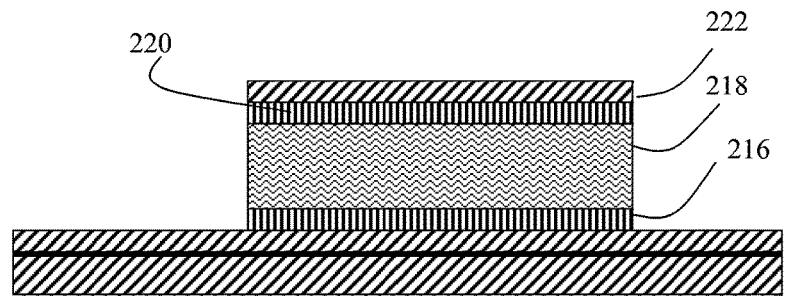
Fig. 8(xii)
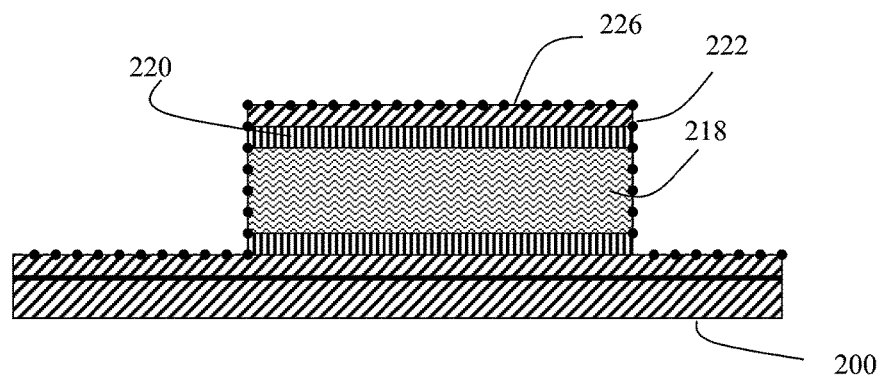
Fig. 8(xiii)
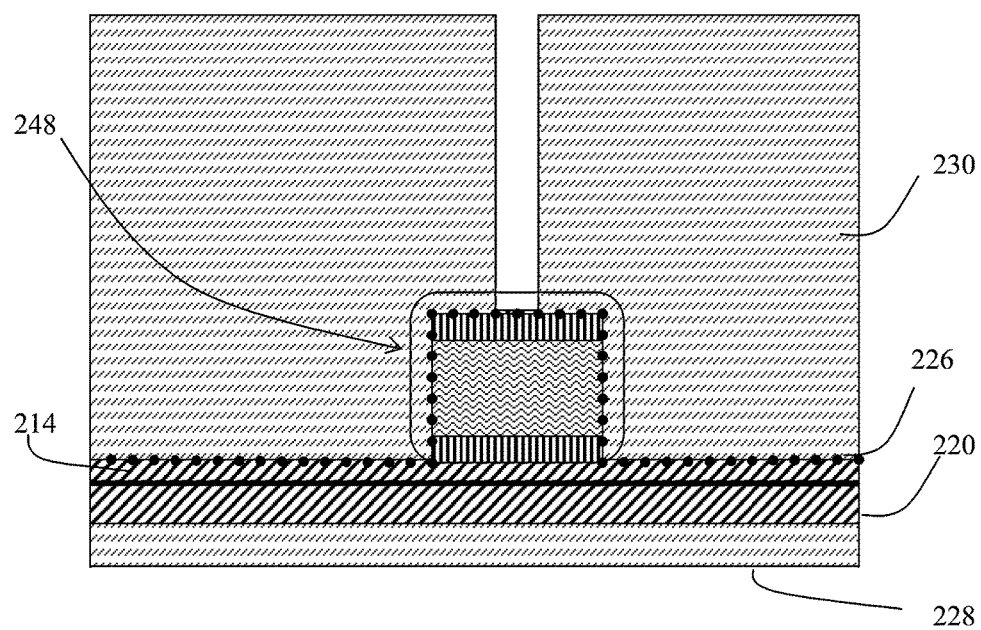
Fig. 8(xiv)

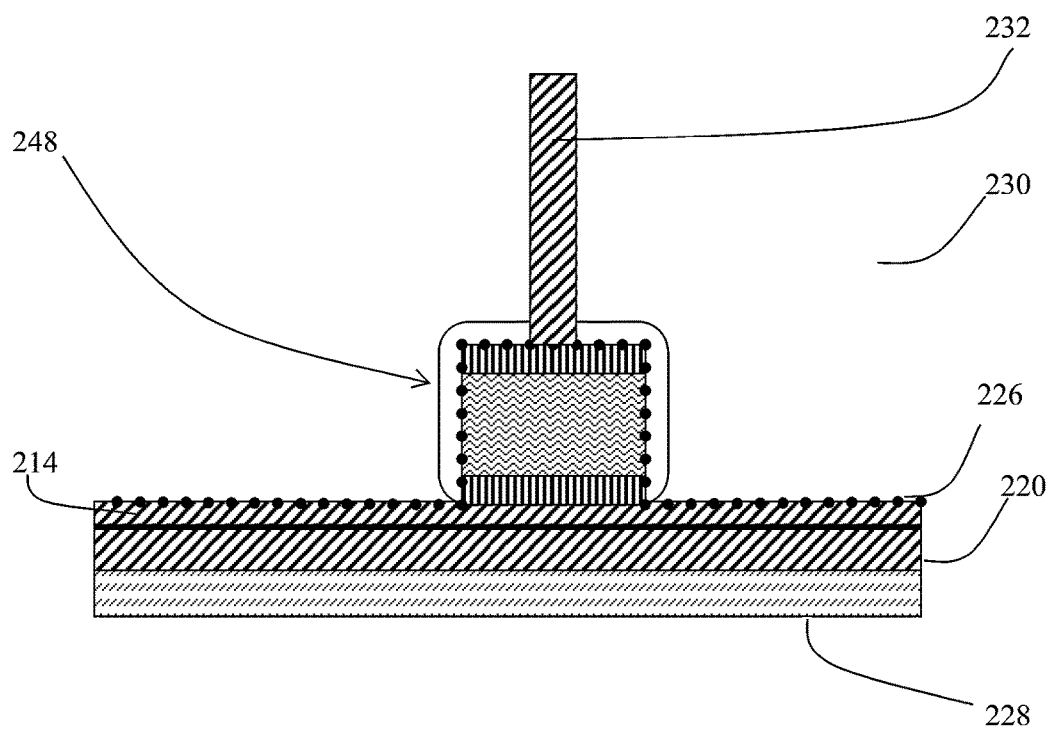
Fig. 8(xvi)

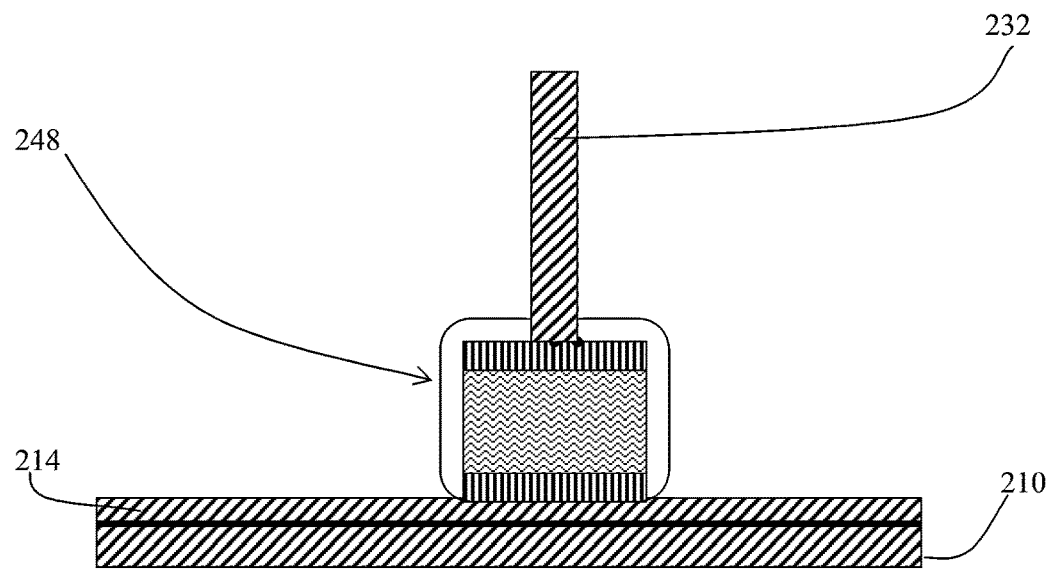
Fig. 8(xvii)
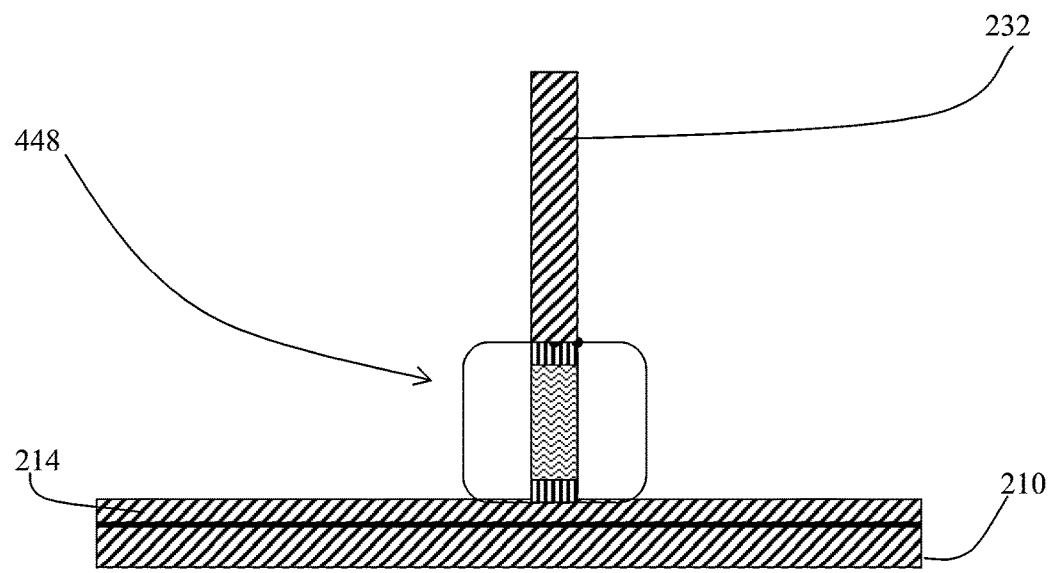
Fig. 8(xviii)

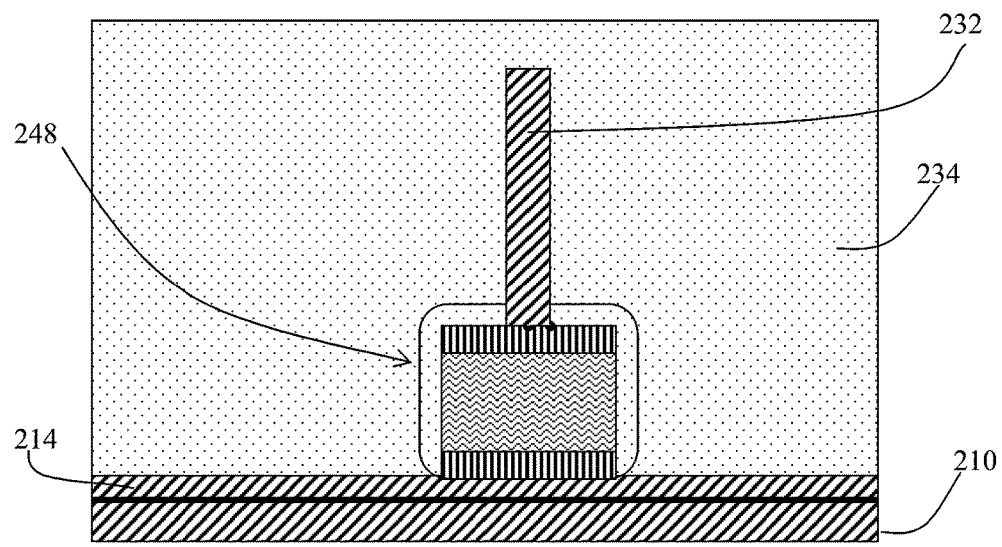
Fig. 8(xix)

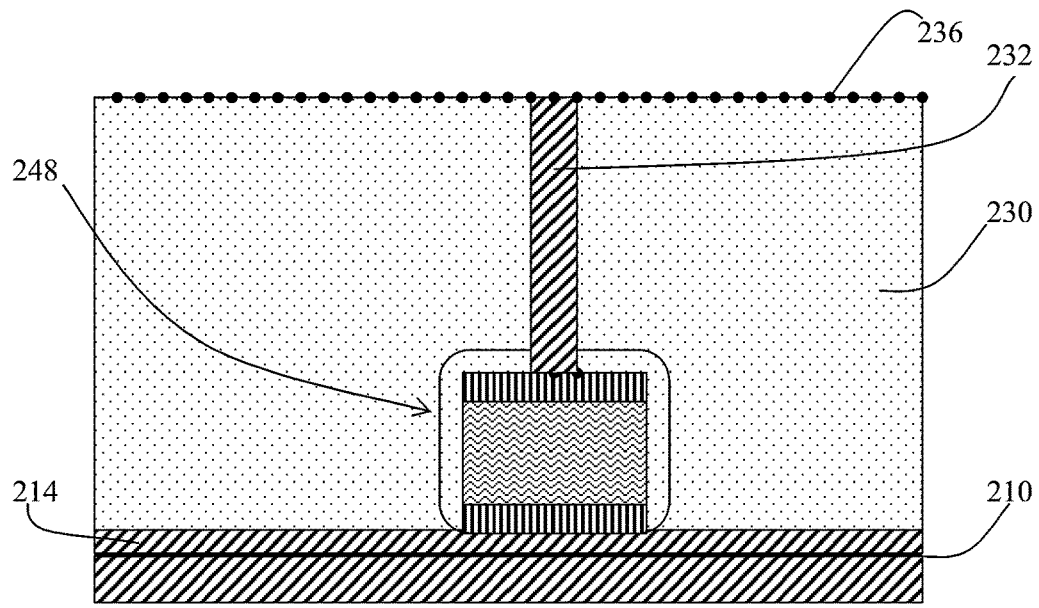
Fig. 8(xxi)
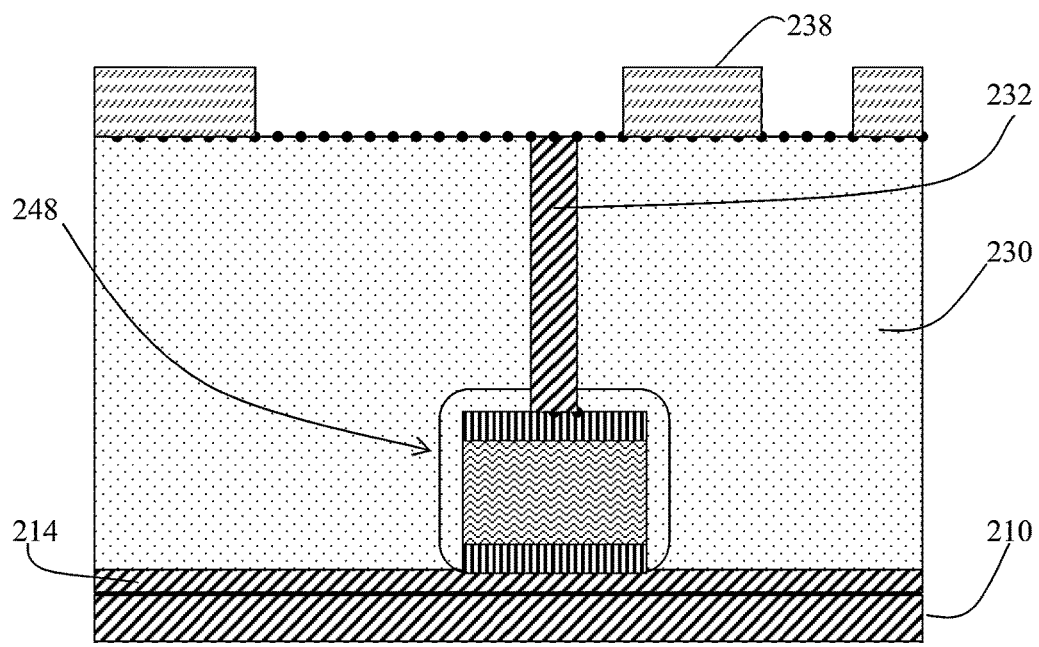
Fig. 8(xxii)

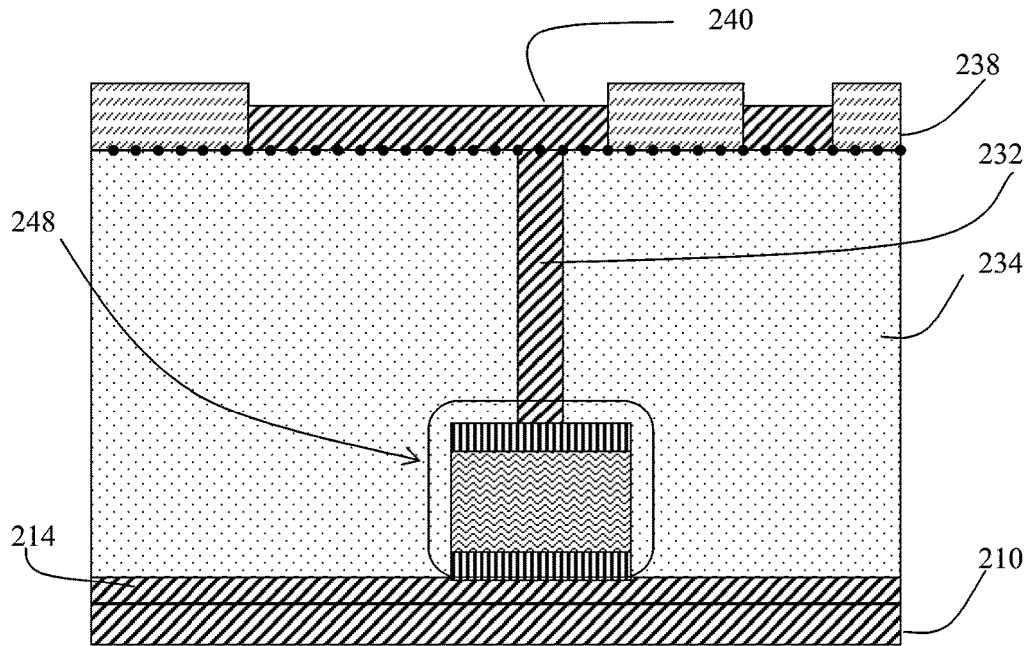
Fig. 8(xxiii)
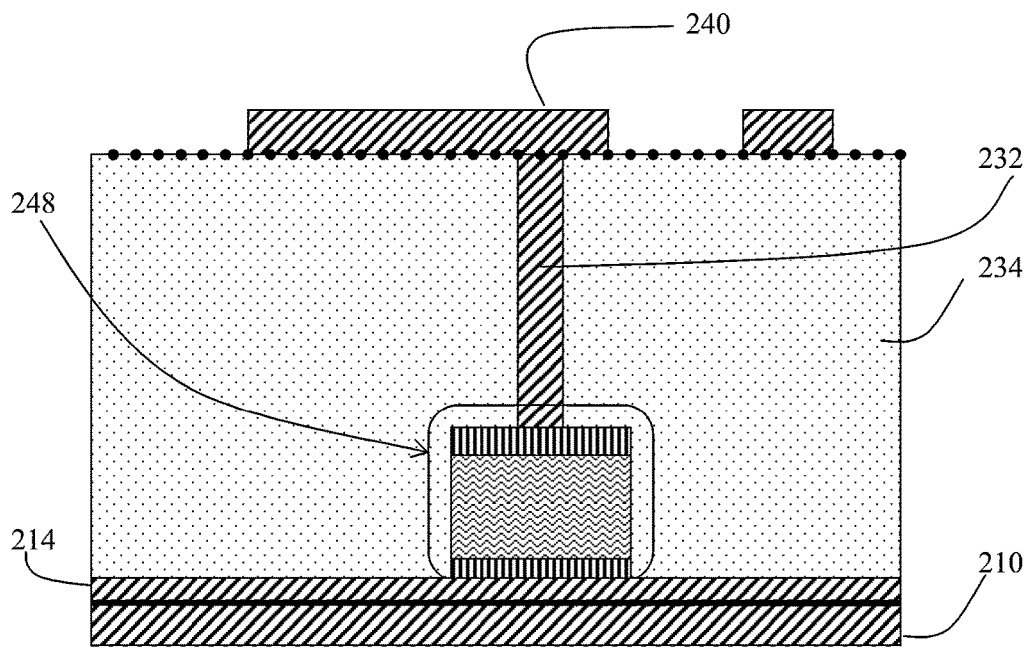
Fig. 8(xxiv)

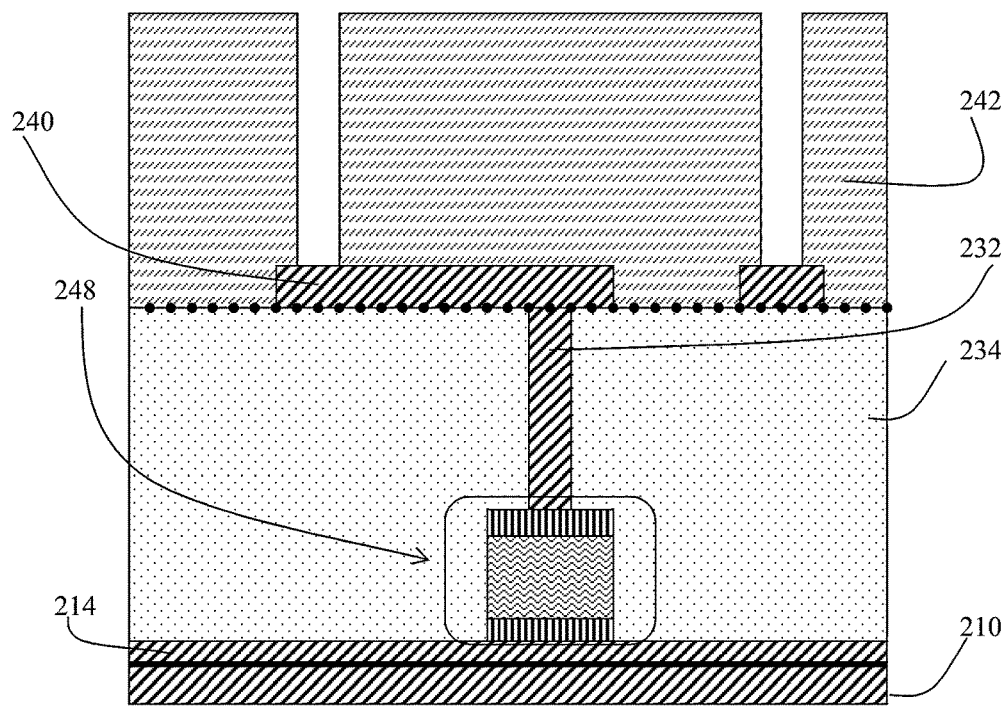
Fig. 8(xxv)
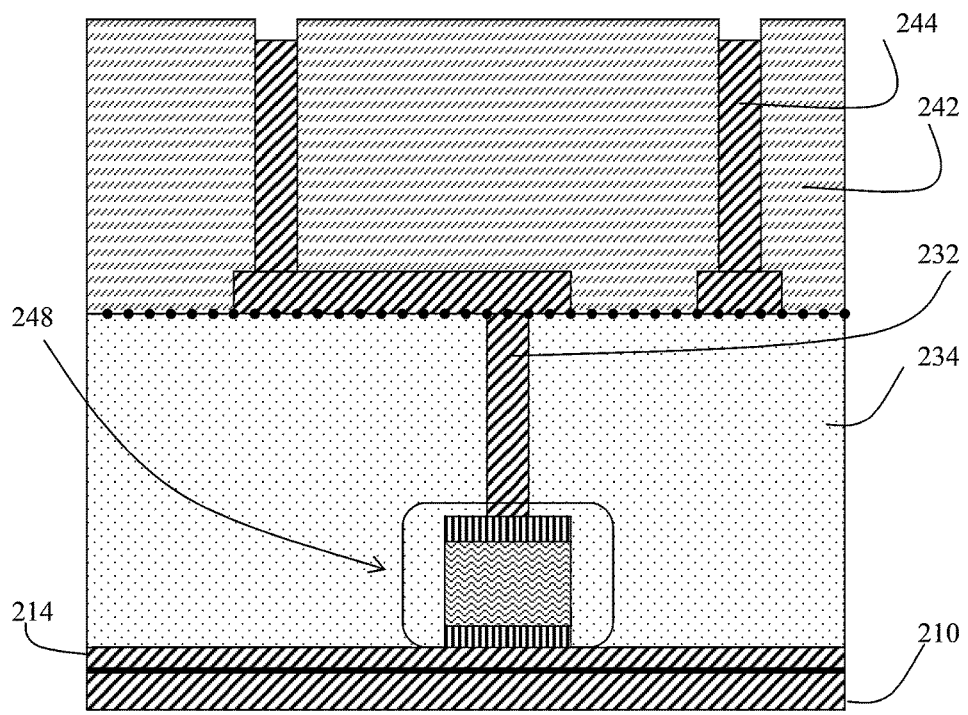
Fig. 8(xxvi)

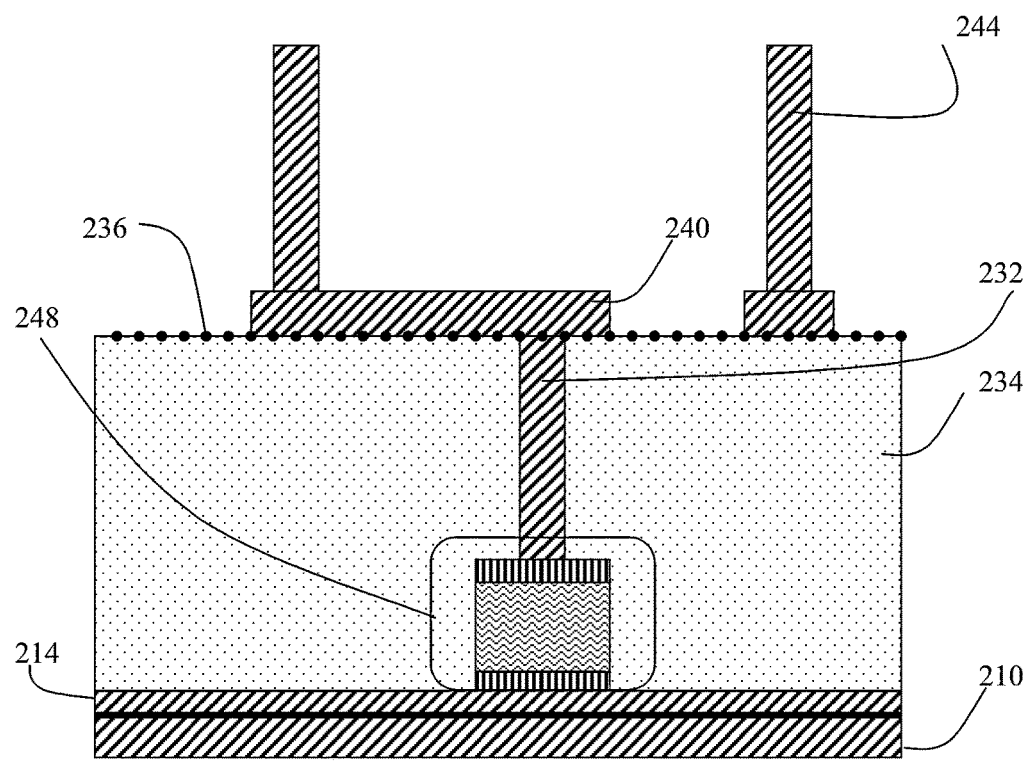
Fig. 8(xxvii)
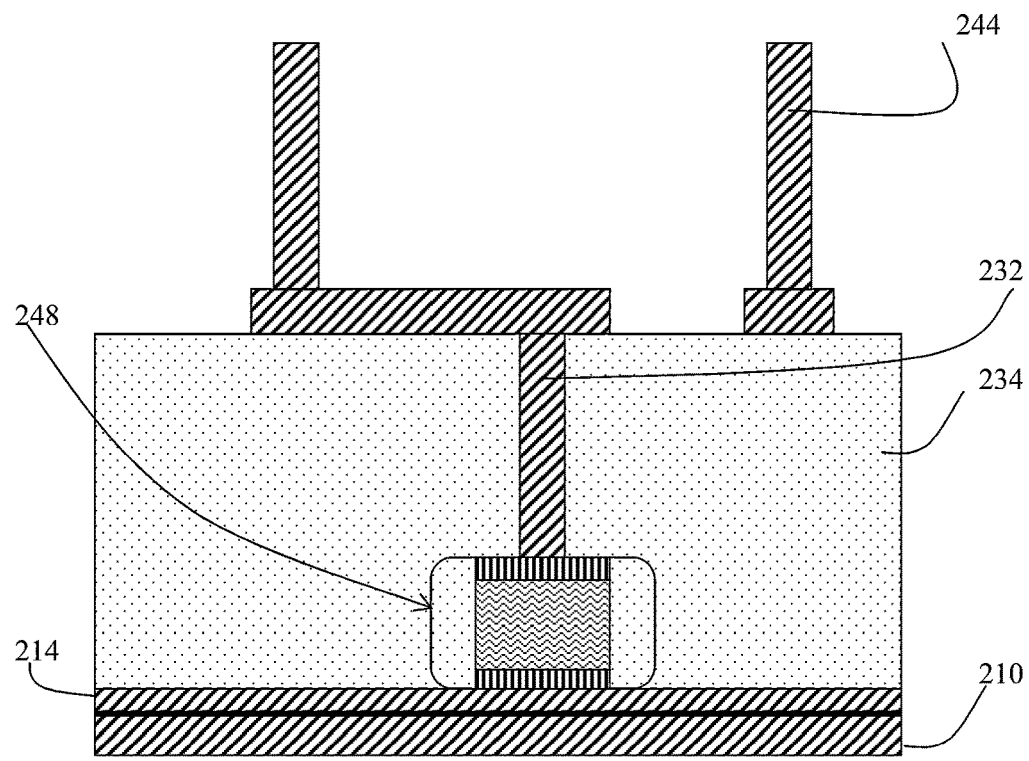
Fig. 8(xxviii)

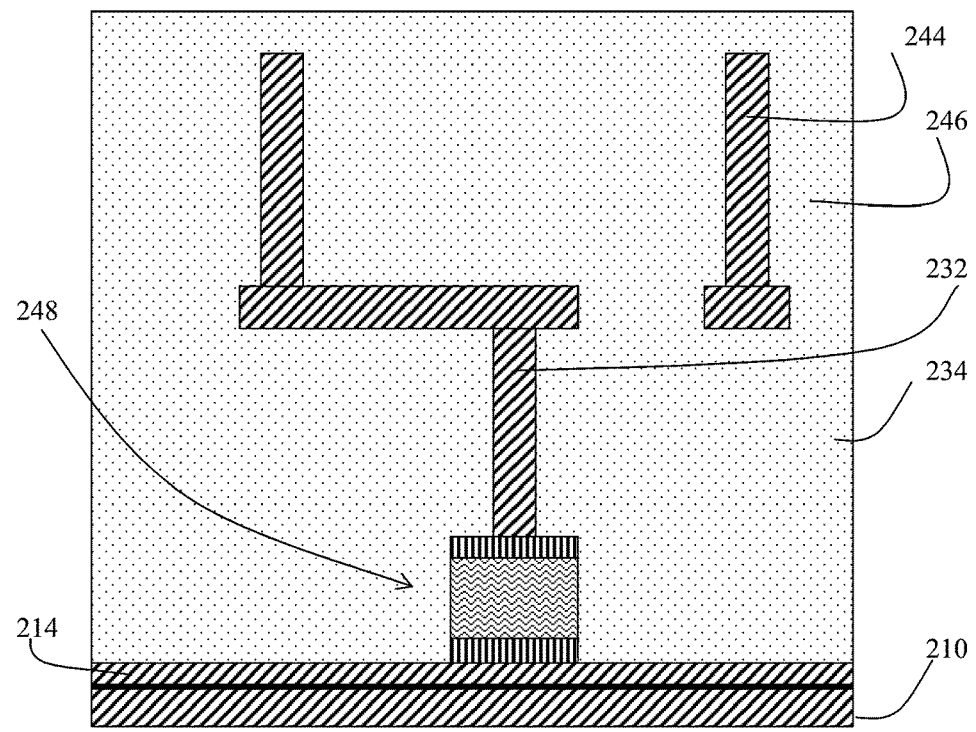
Fig. 8(xxix)
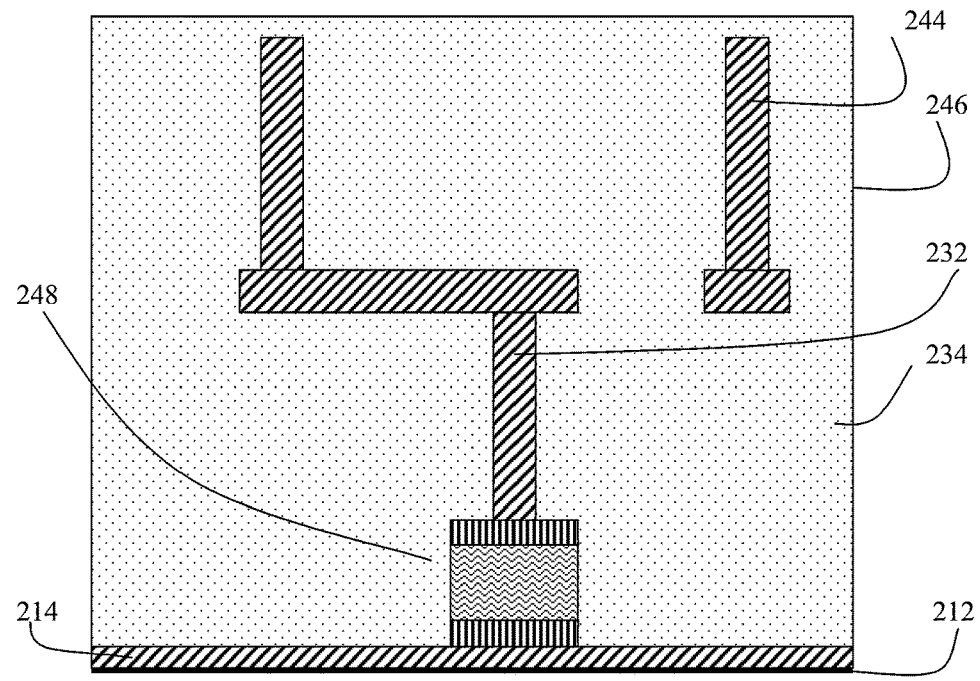
Fig. 8(xxx)

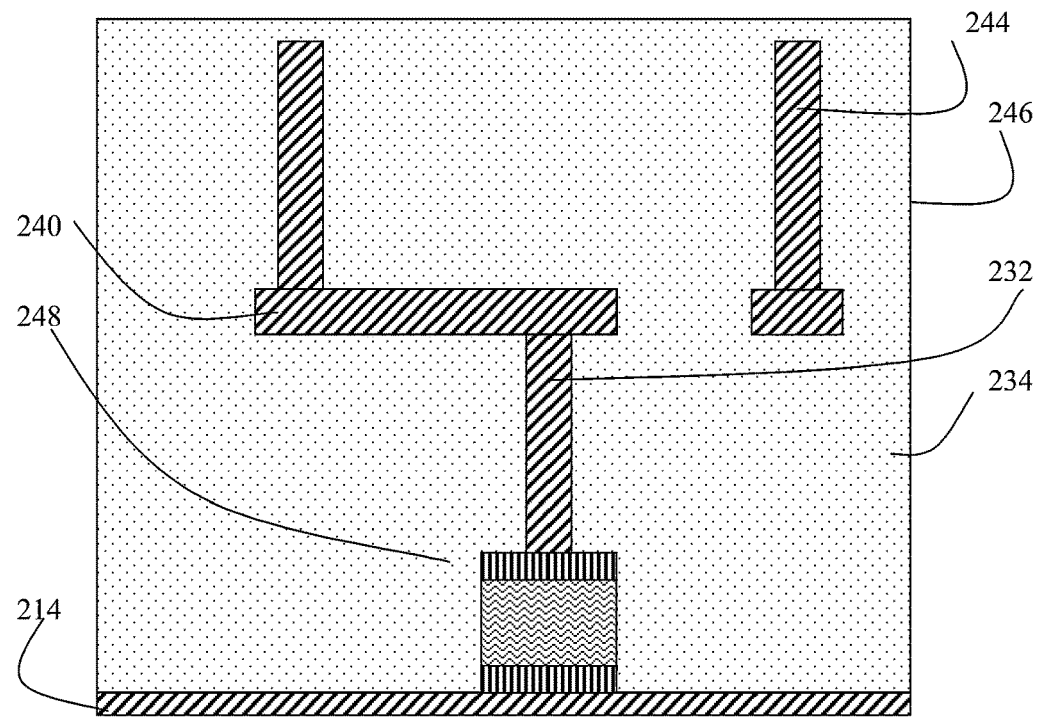
Fig. 8(xxxi)
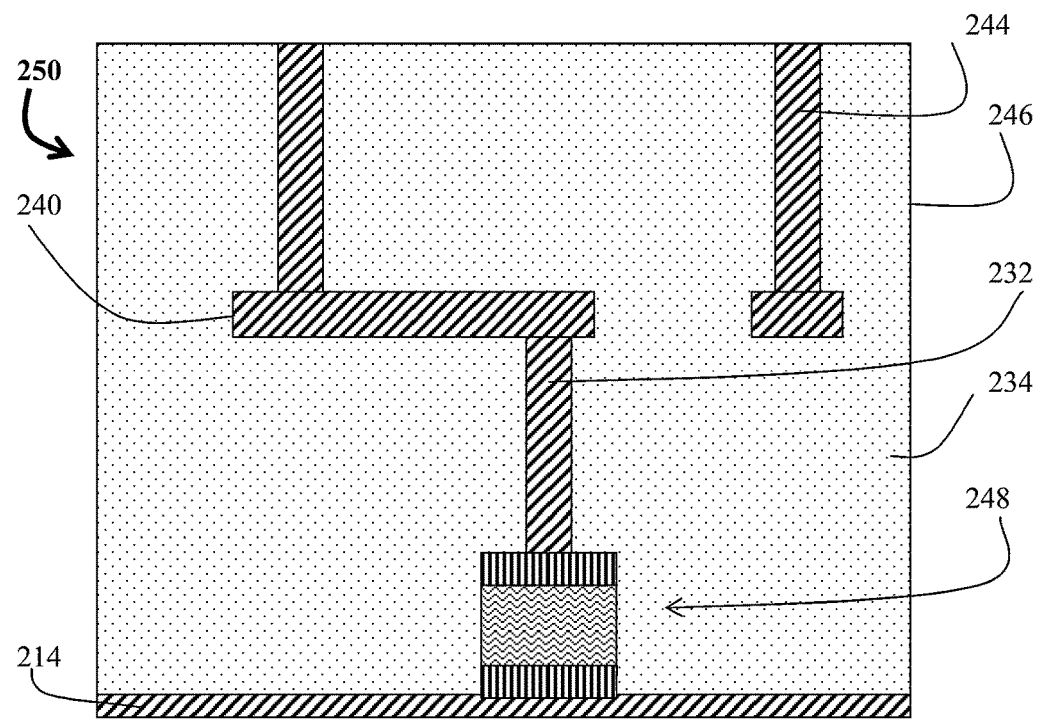
Fig. 8(xxxii)

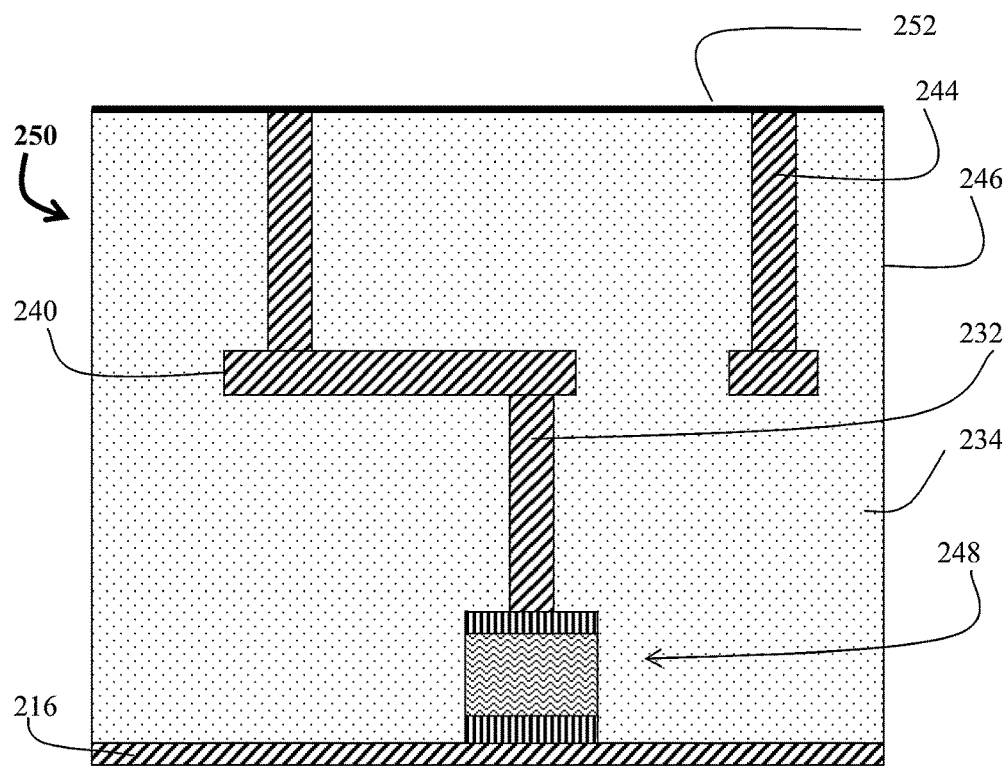
Fig. 9(xxxiii)
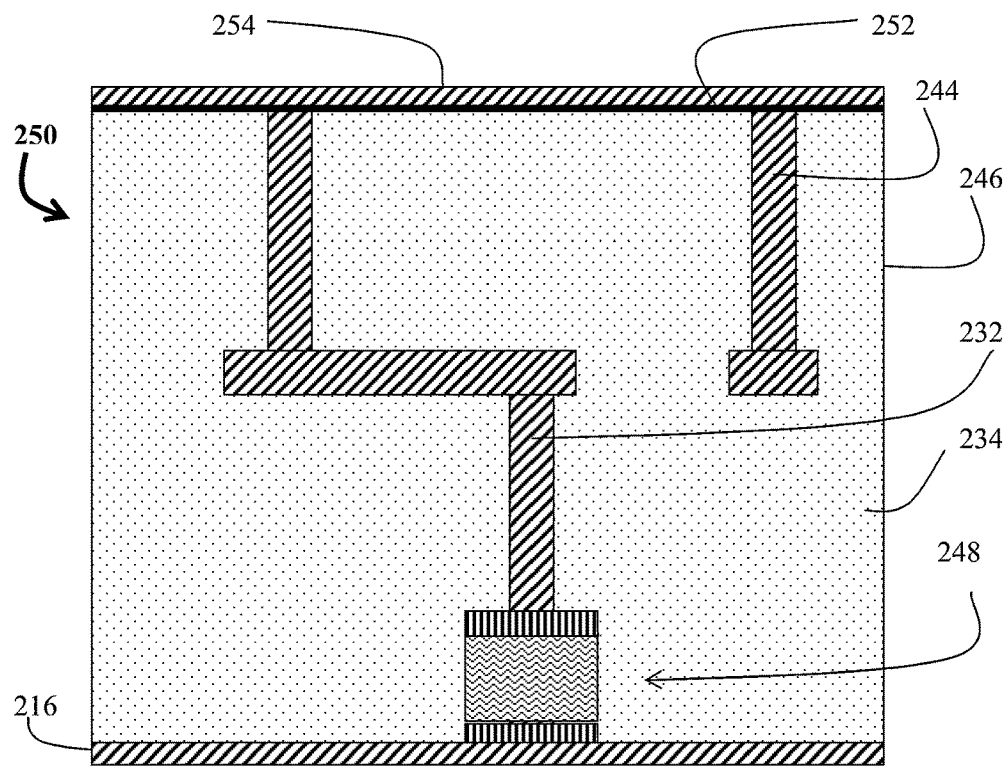
Fig. 9(xxxiv)

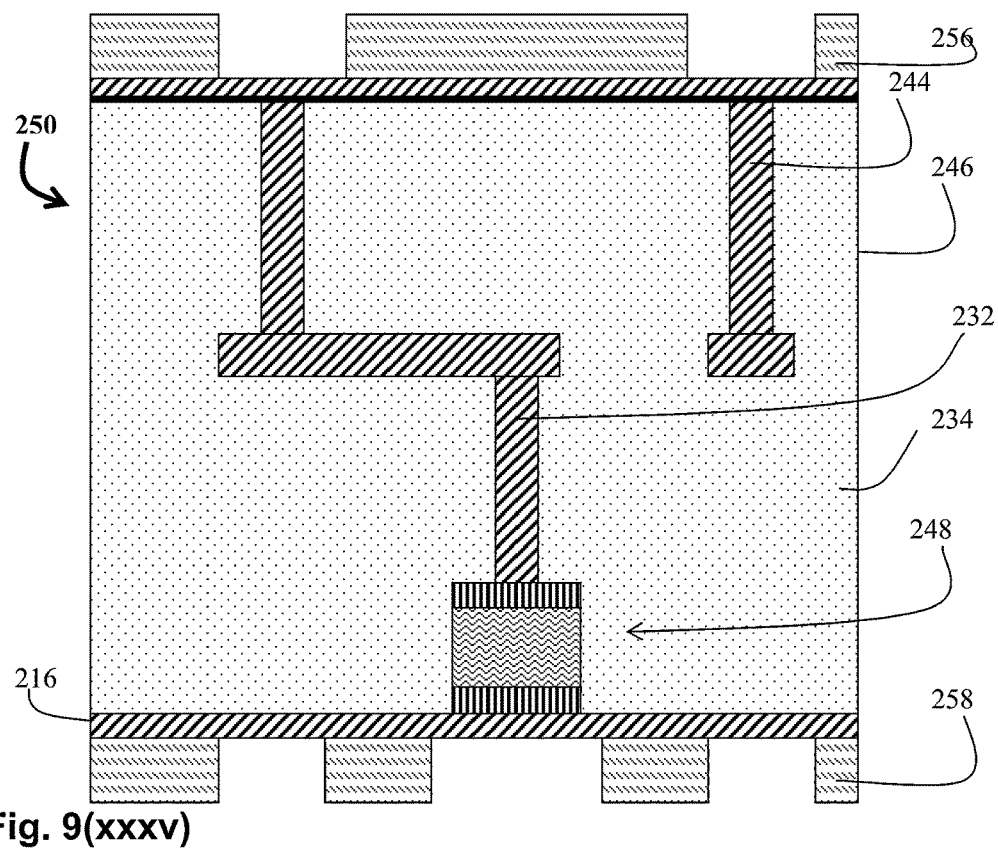
Fig. 9(xxxv)
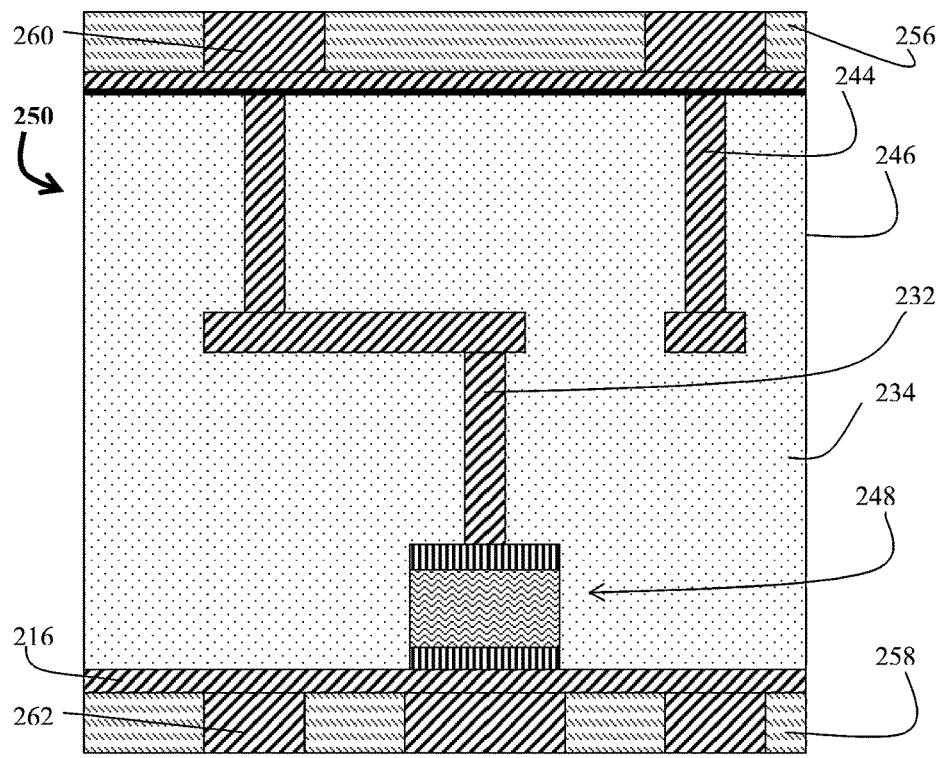
Fig. 9(xxxvi)

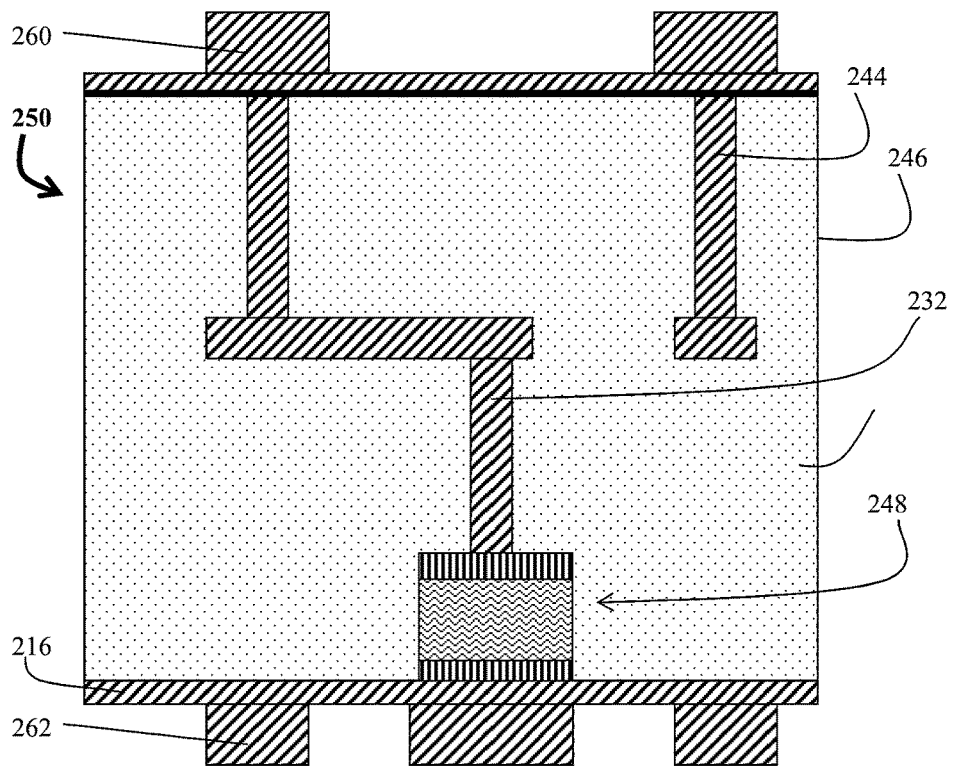
Fig. 9(xxxvii)
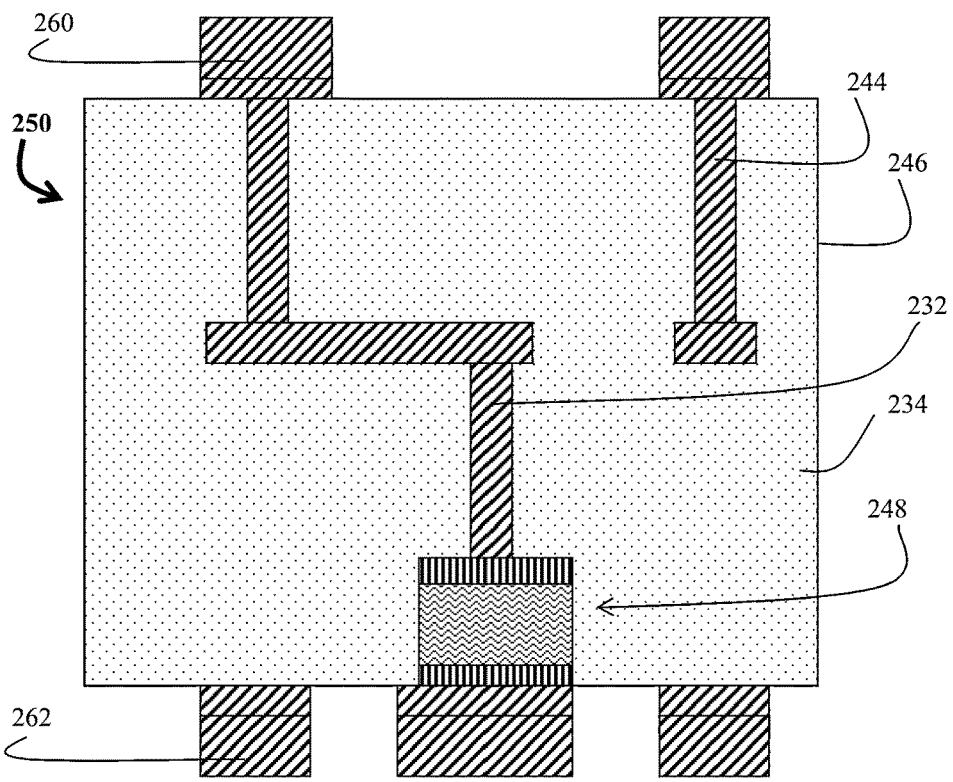
Fig. 9(xxxviii)

Fig. 9(xxxix)

MULTILAYER ELECTRONIC STRUCTURES WITH EMBEDDED FILTERS

BACKGROUND

Field of the Disclosure

The present invention is directed to passive components such as filters, and to multilayer interconnect structures with embedded filters and the like.

Description of the Related Art

Driven by an ever greater demand for miniaturization of ever more complex electronic components, consumer electronics such as computing and telecommunication devices are becoming more integrated. This has created a need for support structures such as IC substrates and IC interposers that have a high density of multiple conductive layers and vias that are electrically insulated from each other by a dielectric material.

The general requirement for such support structures is reliability and appropriate electrical performance, thinness, stiffness, planarity, good heat dissipation and a competitive unit price.

Of the various approaches for achieving these requirements, one widely implemented manufacturing technique that creates interconnecting vias between layers uses lasers to drill holes through the subsequently laid down dielectric substrate through to the latest metal layer for subsequent filling with a metal, usually copper, that is deposited therein by a plating technique. This approach to creating vias is sometimes referred to as 'drill & fill', and the vias created thereby may be referred to as 'drilled & filled vias'.

There are a number of disadvantages with the drilled & filled via approach. Since each via is required to be separately drilled, the throughput rate is limited, and the costs of fabricating sophisticated, multi-via IC substrates and interposers becomes prohibitive. In large arrays it is difficult to produce a high density of high quality vias having different sizes and shapes in close proximity to each other by the drill & fill methodology. Furthermore, laser drilled vias have rough sides walls and taper inwards through the thickness of the dielectric material. This tapering reduces the effective diameter of the via. It may also adversely affect the electrical contact to the previous conductive metal layer especially at ultra small via diameters, thereby causing reliability issues. Additionally, the side walls are particularly rough where the dielectric being drilled is a composite material comprising glass or ceramic fibers in a polymer matrix, and this roughness may create additional stray inductances.

The filling process of the drilled via holes is usually achieved by copper electroplating. The electroplating deposition technique may result in dimpling, where a small crater appears at the top of the via. Alternatively, overfill may result, where a via channel is filled with more copper than it can hold, and a domed upper surface that protrudes over the surrounding material is created. Both dimpling and overfill tend to create difficulties when subsequently stacking vias one on top of the other, as required when fabricating high-density substrates and interposers. Furthermore, it will be appreciated that large via channels are difficult to fill uniformly, especially when they are in proximity to smaller vias within the same interconnecting layer of the interposer or IC substrate design.

While the range of acceptable sizes and reliability is improving over time, the disadvantages described hereinabove are intrinsic to the drill & fill technology and are expected to limit the range of possible via sizes. It will further be noted that laser drilling is best for creating round via channels. Although slot shaped via channels may theoretically be fabricated by laser milling, in practice, the range of geometries that may be fabricated is somewhat limited and vias in a given support structure are typically cylindrical and substantially identical.

Fabrication of vias by drill & fill is expensive and it is difficult to evenly and consistently fill the via channels created thereby with copper using the relatively, cost-effective electroplating process.

Laser drilled vias in composite dielectric materials are practically limited to $60 \times 10^{-6}$ m (60 microns) diameter, and even so suffer from significant tapering shape as well as rough side walls due to the nature of the composite material drilled, in consequence of the ablation process involved.

In addition to the other limitations of laser drilling as described hereinabove, there is a further limitation of the drill & fill technology in that it is difficult to create different diameter vias in the same layer, since when drill different sized via channels are drilled and then filled with metal to fabricate different sized vias, the via channels fill up at different rates. Consequently, the typical problems of dimpling or overfill that characterize drill & fill technology are exasperated, since it is impossible to simultaneously optimize deposition techniques for different sized vias.

An alternative solution that overcomes many of the disadvantages of the drill & fill approach, is to fabricate vias by depositing copper or other metal into a pattern created in a photo-resist, using a technology otherwise known as 'pattern plating'.

In pattern plating, a seed layer is first deposited. Then a layer of photo-resist is deposited thereover and subsequently exposed to create a pattern, and selectively removed to make trenches that expose the seed layer. Via posts are created by depositing Copper into the photo-resist trenches. The remaining photo-resist is then removed, the seed layer is etched away, and a dielectric material, that is typically a polymer impregnated glass fiber mat, is laminated thereover and therearound to encase the vias posts. Various techniques and processes can then be used to planarize the dielectric material, removing part of it to expose the tops of the via posts to allow conductive connection to ground thereby, for building up the next metal layer thereupon. Subsequent layers of metal conductors and via posts may be deposited there onto by repeating the process to build up a desired multilayer structure.

In an alternative but closely linked technology, known hereinafter as 'panel plating', a continuous layer of metal or alloy is deposited onto a substrate. A layer of photo-resist is deposited on top of the substrate, and a pattern is developed therein. The pattern of developed photo-resist is stripped away, selectively exposing the metal thereunder, which may then be etched away. The undeveloped photo-resist protects the underlying metal from being etched away, and leaves a pattern of upstanding features and vias.

After stripping away the undeveloped photo-resist, a dielectric material, such as a polymer impregnated glass fiber mat, may be laminated around and over the upstanding copper features and/or via posts. After planarizing, subsequent layers of metal conductors and via posts may be deposited there onto by repeating the process to build up a desired multilayer structure.

The via layers created by pattern plating or panel plating methodologies described above are typically known as 'via posts' and feature layers from copper.

It will be appreciated that the general thrust of the microelectronic evolution is directed towards fabricating ever smaller, thinner, lighter and more powerful products having high reliability. The use of thick cored interconnects prevents ultra-thin products being attainable. To create ever higher densities of structures in the interconnect IC substrate or 'interposer', ever more layers of ever smaller connections are required. Indeed, sometimes it is desirable to stack components on top of each other.

If plated, laminated structures are deposited on a copper or other appropriate sacrificial substrate, the substrate may be etched away leaving free standing, coreless laminar structures. Further layers may be deposited on the side previously adhered to the sacrificial substrate, thereby enabling a two sided build up, which minimizes warping and aids the attaining of planarity.

One flexible technology for fabricating high density interconnects is to build up pattern or panel plated multilayer structures consisting of metal vias or features in a dielectric matrix. The metal may be copper and the dielectric may be a fiber reinforced polymer. Typically a polymer with a high glass transition temperature ($T_g$) is used, such as polyimide, for example. These interconnects may be cored or coreless, and may include cavities for stacking components. They may have odd or even numbers of layers. Enabling technology is described in previous patents issued to Amitec-Advanced Multilayer Interconnect Technologies Ltd.

For example, U.S. Pat. No. 7,682,972 to Hurwitz et al. titled "Advanced multilayer coreless support structures and method for their fabrication" describes a method of fabricating a free standing membrane including a via array in a dielectric, for use as a precursor in the construction of superior electronic support structures, includes the steps of fabricating a membrane of conductive vias in a dielectric surround on a sacrificial carrier, and detaching the membrane from the sacrificial carrier to form a free standing laminated array. An electronic substrate based on such a free standing membrane may be formed by thinning and planarizing the laminated array, followed by terminating the vias. This publication is incorporated herein by reference in its entirety.

U.S. Pat. No. 7,669,320 to Hurwitz et al. titled "Coreless cavity substrates for chip packaging and their fabrication" describes a method for fabricating an IC support for supporting a first IC die connected in series with a second IC die; the IC support comprising a stack of alternating layers of copper features and vias in insulating surround, the first IC die being bondable onto the IC support, and the second IC die being bondable within a cavity inside the IC support, wherein the cavity is formed by etching away a copper base and selectively etching away built up copper. This publication is incorporated herein by reference in its entirety.

U.S. Pat. No. 7,635,641 to Hurwitz et al. titled "integrated circuit support structures and their fabrication" describes a method of fabricating an electronic substrate comprising the steps of; (A) selecting a first base layer; (B) depositing a first etchant resistant barrier layer onto the first base layer; (C) building up a first half stack of alternating conductive layers and insulating layers, the conductive layers being interconnected by vias through the insulating layers; (D) applying a second base layer onto the first half stack; (E) applying a protective coating of photo-resist to the second base layer; (F) etching away the first base layer; (G) removing the protective coating of photo-resist; (H) removing the first etchant resistant barrier layer; (I) building up a second half stack of alternating conductive layers and insulating layers, the conductive layers being interconnected by vias through the insulating layers, wherein the second half stack has a substantially symmetrical lay up to the first half stack; (J) applying an insulating layer onto the second half stack of alternating conductive layers and insulating layers, (K) removing the second base layer, and (L) terminating the substrate by exposing ends of vias on outer surfaces of the stack and applying terminations thereto. This publication is incorporated herein by reference in its entirety.

RF (Radio Frequency) technologies, such as Wifi, Bluetooth and the like, are becoming widely implemented in various devices, including mobile phones and automobiles.

In addition to Base Band processing and memory chips, RF devices in particular, require passive components such as capacitors, inductors and filters of various sorts. Such passive components may be surface mounted, but to enable ever greater miniaturization and cost savings, such devices may be embedded within the chip or substrates.

One advantage of the via post fabrication process is that shaped vias may be generated instead of simple cylindrical ones. This provides great flexibility in shaping of capacitors and also enables fabrication of high inductance vias that function as conductors between different positions in the xy plan, and facilitates the formation of filters consisting of combination of capacitors and inductors.

BRIEF SUMMARY

A first aspect of the invention is directed to providing a composite electronic structure comprising at least one feature layer and at least one adjacent via layer, said layers extending in an X-Y plane and having height z, wherein the composite electronic structure comprises at least one capacitor coupled with at least one inductor, the at least one capacitor comprising a lower electrode and a dielectric layer and being incorporated at a base of a via layer sandwiched between the at least one feature layer and a via post, such that the at least one via stands on the at least one capacitor, and optionally forms an upper electrode, wherein the via layer is embedded in a polymer matrix, and wherein the at least one inductor is formed in at least one of the first feature layer and the adjacent via layer.

Optionally, the at least one capacitor and the at least one inductor are coupled in series.

Optionally, the at least one capacitor and the at least one inductor are coupled in parallel.

The at least one inductor may be fabricated in the feature layer.

The at least one inductor in the feature layer is typically spirally coiled.

Typically, the inductance of the inductor in the feature layer is at least 0.1 nH.

Typically, the inductance of the inductor in the feature layer is less than 50 nH.

Optionally, a further inductor is fabricated in a via layer.

In some embodiments, the at least one inductor is fabricated in a via layer.

In such cases, the inductance of the inductor is typically, at least 1 nH.

In such cases, the inductance of the inductor is typically less than 10 nH

In some structures, the at least one inductor and said at least one capacitor provide a filter, said filter being selected from the group consisting of basic LC low pass filters, LC high pass filters, LC series band pass filters, LC parallel band pass filters and Low Pass Parallel-Chebyshev filters.

Optionally, the polymer matrix comprises a polymer selected from the group comprising polyimides, epoxys, BT (Bismaleimide/Triazine) and their blends.

Optionally, the polymer matrix further comprises glass fibers.

Optionally, the polymer matrix further comprises inorganic particulate fillers having mean particle size of between 0.5 microns and 30 microns and between 15% and 30% of particulate by weight.

Typically, the capacitor comprises a ceramic dielectric.

Optionally, the dielectric of the capacitor comprises at least one of the group consisting of Ta2O5, $TiO_2$, $BaO_4SrTi$ and $Al_2O_3$.

Typically, the lower electrode comprises a noble metal.

Optionally, the lower electrode comprises a metal selected from the group consisting of gold, platinum and tantalum.

Optionally, the upper electrode comprises a metal selected from the group consisting of gold, platinum and tantalum.

Alternatively, the upper electrode comprises the via post.

In some embodiments, the capacitor has a cross sectional area defined by a cross sectional area of the via post, that is carefully controlled to tune capacitance of capacitor.

Typically, the at least one capacitor has a capacitance of between 1.5 pF and 300 pF.

Optionally, the at least one capacitor has a capacitance of between 5 and 15 pF.

A second aspect is directed to providing a method of fabricating filters in an array, comprising fabricating capacitors by depositing a first electrode and a layer of ceramic and applying a via post over part of the layer of ceramic such that size of footprint of the via post on the layer of ceramic defines controls capacitance of the capacitor, and fabricating inductors by electroplating copper into a pattern of photoresist, stripping away the photoresist and laminating.

Typically, the dielectric material comprises a ceramic material selected from the group consisting of Ta2O5, $TiO_2$, $BaO_4SrTi$ and $Al_2O_3$.

Typically, the layer of electrode is selected from the group consisting of gold, platinum and tantalum.

Optionally, the method further comprises depositing an upper electrode selected from the group consisting of gold, platinum and tantalum, depositing accurately sized copper via posts over the upper electrode, and selectively removing excess upper electrode, dielectric and lower electrode to control size of the capacitor.

Optionally, the excess upper electrode, the dielectric and the lower electrode are removed by plasma etching.

In some embodiments, the capacitors are fabricated by a method comprising the steps of: (i) procuring a carrier; (ii) depositing a barrier layer; (iii) thinning barrier layer; (iv) depositing a thin layer of copper above the carrier layer; (v) depositing a first layer of electrode material; (vi) depositing a layer of dielectric material; (vii) depositing a second layer of electrode material; (viii) depositing an upper copper layer over the second electrode, (ix) applying photoresist over the upper copper layer and patterning; (x) etching away exposed copper of the upper copper layer; (xi) etching away exposed material of the second electrode layer, exposed dielectric material in the layer of dielectric material and exposed material in the first layer of electrode, and (xii) stripping away the photoresist.

Optionally, step (vi) of depositing a layer of dielectric material comprises sputtering a layer of ceramic, and further comprises previously or subsequently depositing a layer of aluminium, and then oxidizing the aluminium to less dense aluminium-oxide, thereby growing aluminum-oxide into defects in the layer of ceramic and sealing the defects.

Optionally, the carrier is selected from the group consisting of a sacrificial copper substrate and a copper carrier with a quick release thin film of copper appended thereto.

In some embodiments, inductors are fabricated by depositing a copper seed layer over a dielectric polymer that is thinned to expose at least one copper via, thereby providing conductive connection; laying down a layer of photoresist; patterning the photoresist to create a shaped via that is elongated; depositing copper into the photoresist to create an inductor; stripping away the photoresist; etching away the seed layer, and laminating.

Optionally, a titanium seed layer is deposited prior to the copper seed layer.

Optionally, inductors are fabricated by depositing a copper seed layer over a dielectric polymer that is thinned to expose at least one copper via, thereby providing conductive connection; laying down a layer of photoresist; patterning the photoresist to create a spiral feature; depositing copper into the photoresist to create an inductor; stripping away the photoresist, and etching away the seed layer.

Typically, he method further comprising laminating.

In some embodiments, a titanium seed layer is deposited prior to the copper seed layer.

In some embodiments, the array of filters is embedded in a polymer matrix; thinned to expose ends of vias; then terminations are applied by laying down photoresist on each side of the thinned polymer matrix; deposing copper pads into the pattern of photoresist; stripping away the photoresist; laying down soldermask between the copper pads, and applying a protective coating.

The protective coating may be selected from ENEPIG and an organic varnish

The term microns or μm refers to micrometers, or $10^{-6}$ m.

BRIEF DESCRIPTION OF THE DRAWINGS

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice. In the accompanying drawings:

FIG. 8(i) to FIG. 8(xxxii) are a series of schematic cross section illustrations illustrating a process for fabricating a substrate with an embedded filter consisting of a capacitor and inductor;

FIG. 9(xxxiii) to FIG. 9(xL) are a series of schematic cross section illustrations illustrating a process for termination a substrate with an embedded filter;

FIG. 10c is a schematic cross section of the basic LC low pass filter of FIG. 10a;

It will be appreciated that the Figures are schematic illustrations only, and are not to scale. Very thin layers may appear thick. The width of features may appear out of proportion to their length, etc.

DETAILED DESCRIPTION

In the description hereinbelow, support structures consisting of metal vias in a dielectric matrix, particularly, copper via posts in a polymer matrix, such as polyimide, epoxy or BT (Bismaleimide/Triazine) or their blends, reinforced with glass fibers are considered.

Structures described below include capacitors. Since parallel plate capacitors comprise a dielectric material sandwiched between electrodes, typically a material with a very high dielectric constant, the dielectric material used for encapsulation is referred to hereinbelow as an encapsulation dielectric to differentiate it from the dielectric of the capacitor.

The figures are illustrative, and no attempt is made to indicate scale. Furthermore, small numbers of vias and individual capacitors and filters are shown, whereas an individual substrate may include several capacitors and filters and large numbers of vias. Indeed, typically large arrays of substrates are cofabricated.

Figure 1:
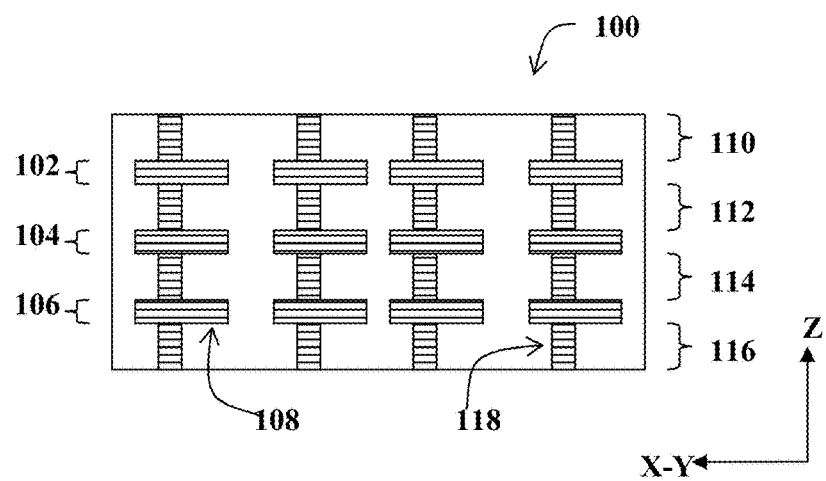
FIG. 1 is a simplified section through a multilayer composite support structure of the prior art.

FIG. 1 is a simplified section through a multilayer composite support structure of the prior art. Multilayer support structures 100 of the prior art include functional layers 102, 104, 106 of components or features 108 separated by layers of encapsulating dielectric 110, 112, 114, 116, which insulate the individual layers. Vias 118 through the encapsulating dielectric layer provide electrical connection between the adjacent functional or feature layers. Thus the feature layers 102, 104, 106 include features 108 generally laid out within the layer, in the X-Y plane, and vias 118 that conduct current across the encapsulating dielectric layers 110, 112, 114, 116. Vias 118 are designed to have minimal inductance and are sufficiently separated to have minimum capacitances therebetween.

Where vias are fabricated with drill & fill technology, the vias generally have a substantially circular cross-section, as they are fabricated by first drilling a laser hole in the dielectric. Since the encapsulating dielectric is heterogeneous and anisotropic, and consists of a polymer matrix with inorganic fillers and glass fiber reinforcements, the circular cross-section thereof is typically rough edged and the cross-sections thereof may be slightly distorted from a true circular shape. Furthermore, the vias tend to taper somewhat, being inverse frusto-conical instead of cylindrical.

It is a feature of Access' photo-resist and pattern or panel plating and laminating technology, as described in U.S. Pat. No. 7,682,972, U.S. Pat. No. 7,669,320 and U.S. Pat. No. 7,635,641 to Hurwitz et al., incorporated herein by reference, that there is no effective upper limit to the in-plane dimensions of a feature.

As described in U.S. Pat. No. 7,682,972, U.S. Pat. No. 7,669,320 and U.S. Pat. No. 7,635,641, for example, the structure of FIG. 1 may alternatively be fabricated by plating within a pattern developed in a photo-resist (pattern plating), or by panel plating and then selectively etching, either way leaving up standing via posts, and then laminating an encapsulating dielectric pre-preg thereover.

Using the 'drilled and filled via' approach, it becomes prohibitive to fabricate non-circular vias due to difficulties in cross-section control and shape. There is also a minimum via size of about 50-60 micron diameter due to the limitations of the laser drilling. These difficulties were described at length in the background section hereinabove and are related, inter-alia, to dimpling and/or domed shaping that result from the copper via fill electro-plating process, via tapering shape and side wall roughness that result from the laser drilling process and higher cost that results from using the expensive laser drilling machine for milling slots, in a 'routing' mode to generate trenches in the polymer/glass dielectrics.

In addition to the other limitations of laser drilling as described hereinabove, there is a further limitation of the drill & fill technology in that it is difficult to create different diameter vias in the same layer, since when different sized via channels are drilled and then filled with metal to fabricate different sized vias, the via channels fill up at different rates. Consequently, the typical problems of dimpling or overfill (doming) that characterize drill & fill technology are exasperated, since it is impossible to simultaneously optimize deposition techniques for different sized vias. Thus in practical applications, drill & fill vias have substantially circular cross-sections albeit sometimes distorted somewhat due to the heterogeneous nature of the substrate, and all vias have substantially similar cross-sections.

Furthermore, it will be noted that laser drilled vias in composite dielectric materials such as polyimide/glass or epoxy/glass or BT (Bismaleimide/Triazine)/glass or their blends with ceramic and/or other filler particles, are practically limited to about $60 \times 10^{-6}$ m diameter, and even so suffer from significant tapering shape as well as rough side walls due to the nature of the composite material drilled, in consequence of the ablation process involved.

It has been surprisingly found that using the flexibility of the plating and photo-resist techniques, a wide range of via shapes and sizes may be cost-effectively fabricated. Furthermore, different via shapes and sizes may be fabricated in the same layer. This is especially facilitated when the copper pattern plating approach is used, by first depositing a metal seed layer and then depositing a photo-resist material and developing smooth, straight, non-tapering trenches therein which may subsequently be filled by depositing copper into these trenches by pattern plating onto the exposed seed layer. In contrast to the drilled & filled via approach, via post technology enables trenches in a photoresist layer to be filled to obtain dimple-less and dome-less copper connectors. After deposition of the copper, the photoresist is subsequent stripped away, the metal seed layer is removed and a permanent, polymer-glass composite encapsulating material is applied thereover and therearound. The 'via conductor' structure thus created may use the process flows as described in U.S. Pat. No. 7,682,972, U.S. Pat. No. 7,669,320 and U.S. Pat. No. 7,635,641 to Hurwitz et al.

In addition to via conductor and features, it has been found possible to fabricate passive components such as capacitors and filters, within structures that include via post technology, by using electroplating, PVD and encapsulation technologies for creating the capacitors and filters.

Figure 2:
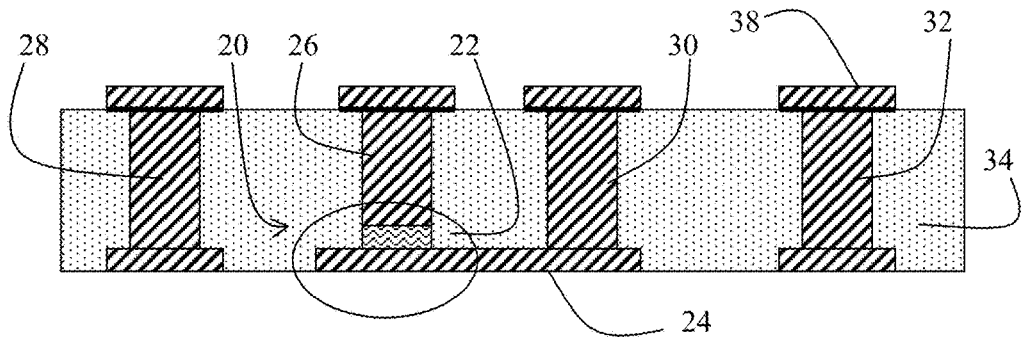
FIG. 2 is a schematic cross-section through a substrate that includes a single layer capacitor and copper vias within a polymer based matrix.

With respect to FIG. 2, a cross section through a one layer parallel plate capacitor 20 is shown consisting of a dielectric material layer 22 deposited over a copper feature layer 24, with a copper pillar 26 grown over the dielectric layer 22. The dielectric material may be $Ta_2O_5$, $BaO_4SrTi$, $TiO_2$, $Al_2O_3$, for example, and may be deposited by a physical vapor deposition process, such as sputtering, for example, or by a chemical vapor deposition process.

To obtain high quality capacitors, the dielectric may include $Ta_2O_5$, $BaO_4SrTi$, $TiO_2$ deposited by a physical vapor process, and may further comprise a layer of aluminium metal that is previously or subsequently deposited, possibly by sputtering along side the ceramic. After depositing, the structure is heated up in the presence of oxygen, either in a furnace or oven, or by exposing to infra red radiation. The aluminium is then converted in situ into aluminium oxide (alumina $Al_2O_3$). Since $Al_2O_3$, is less dense than aluminium, it spreads and seals defects into the ceramic layer, ensuring a high dielectric constant, and preventing leakage.

The copper pillars 26, 28, 30, 32 are encapsulated in an encapsulating dielectric material 34. Where copper pillars 26, 28, 30, 32 are fabricated as via posts using electroplating, the encapsulating dielectric material 34 may be a glass fiber reinforced polymer resin prepreg that is laminated over the copper pillars 26, 28, 30, 32.

The copper feature layer 24 may have a thickness of about 15 microns, with a tolerance of about +−5 microns. Each via post layer is typically about 40 microns but may be anywhere from, say, 20 microns to 80 microns. Outer feature layers 24, 38 which may be termination pads, are again typically about 15 microns but may be anywhere from, say, 10 microns to 25 microns.

The capacitance of a capacitor is defined by the dielectric constant of the dielectric layer multiplied by the surface area of the capacitor, which is the area of the via pillar 26, divided by the thickness of the dielectric layer 22.

Using the simple one layer capacitor of FIG. 2, it is possible to optimize the thickness of the dielectric material 22 and the deposition process thereof. The capacitance is a property of the dielectric constant of the dielectric material 22, and of the area of the metal electrodes, which, in this case, is the cross-sectional area of the copper pillar 26.

In typical embodiments, noble metal electrodes, typically from tantalum, but optionally from gold or platinum are applied on either side of the dielectric layer. The capacitor is thus incorporated within a via layer at the base of a via post. Keeping the thickness and nature of the dielectric layer constant, where the via post defines the upper electrode, it defines and can be used to fine tune the capacitance, As explained in more detail hereinbelow, even where tantalum electrodes are used, deposition of a carefully sized via post, which may be formed by electroplating and thus need not be cylindrical, but may be rectangular or have another cross-section shape, enables plasma etching away of the electrode and dielectric layers of the capacitor, leaving the capacitor sandwich only by a selective etch that removes tantalum and tantalum oxide but does not harm copper, such as Hydrogen fluoride and oxygen, for example.

Combinations of capacitors and inductors may serve as filters, protecting chips from fluctuating currents and noise. Such filters are of particular importance with regard to RF telecommunications, such as WIFI, Bluetooth, and the like. Filters may serve to isolate parts of a circuit from other elements, to prevent interference.

Figure 3:
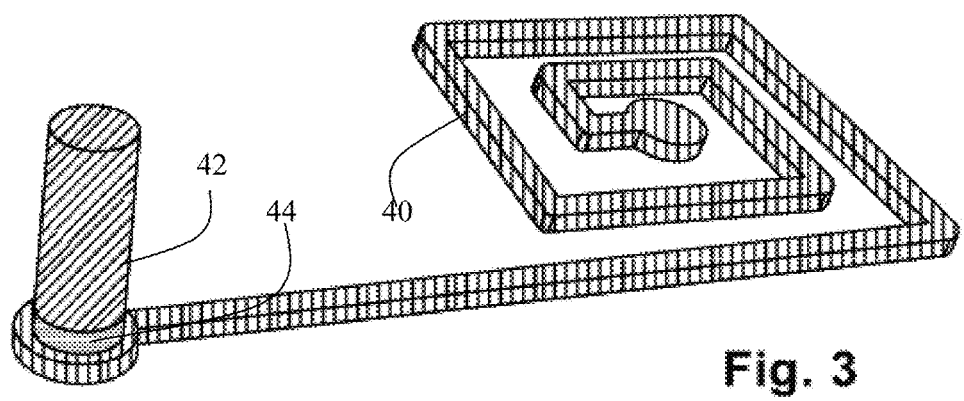
FIG. 3 is a schematic projection of an inductor within a feature layer and an adjacent via post in a via post layer standing on a capacitor that is coupled in series with the inductor.

With reference to FIG. 3, there is shown a schematic projection of an inductor 40 within a feature layer and an adjacent via post 42 in a via post layer standing on a capacitor 44 that is coupled in series with the inductor 40. The structure shown may be fabricated from copper, with the capacitor 44 comprising a dielectric material such as $Ta_2O_5$, $BaO_4SrTi$, and $TiO_2$, and typically has electrodes of tantalum or another noble metal. Typically, the via post will be encapsulated within a polymer dielectric, which may include fillers, and may be a woven fiber prepreg. The feature layer including the inductor 40 may be first deposited with the capacitor 44 and via post 42 built up thereover, the polymer based dielectric material, which may be a polymer film or a woven fiber pre-preg, may be laminated over the feature and via layers. Alternatively, the via post 42 and capacitor 44 may be fabricated and laminated first, with the inductor 40 then deposited thereover, and left non-laminated, or may be subsequently laminated with additional via layers, not shown.

Figure 4:
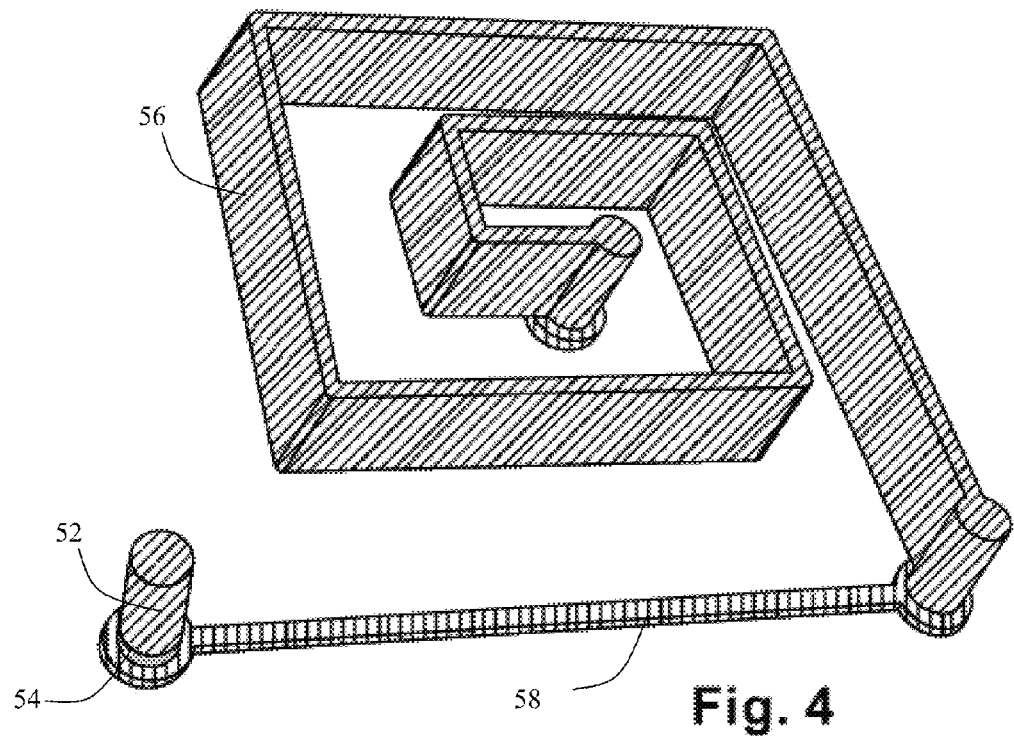
FIG. 4 is a schematic projection of an inductor via within a via layer coupled in series with a capacitor at a base of a via post.

It will be appreciated that the feature layer is very thin, typically about 10 microns. The via layer however, is rather thicker. FIG. 4 is a schematic projection of an inductor via 56 that extends within the via layer coupled in series with a capacitor 54 at a base of a via post 52. The capacitor 54 is coupled to the inductor via 56 by a trace 58 deposited in the feature layer. Inductor via 56 has a thickness of about 30 microns and has different characteristics from feature layer inductor 40 of FIG. 3. Typically, the inductor via 40 is a high Q inductor having an inductance ranging from about 0.1 nH to about 10 nH.

Figure 5:
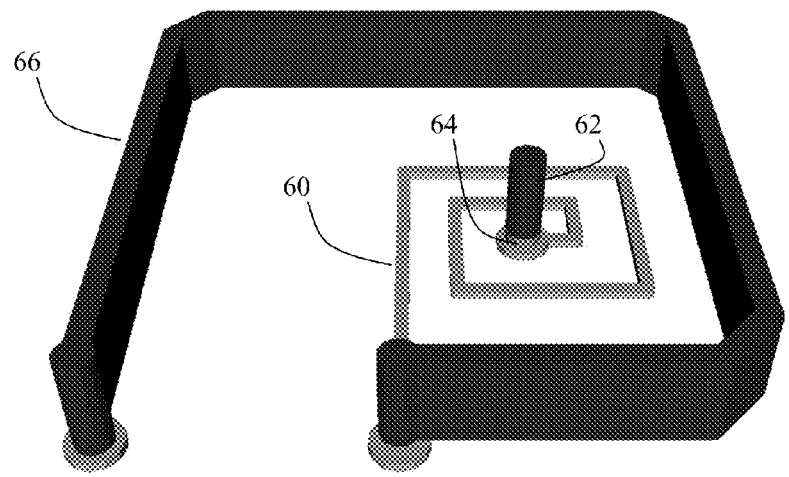
FIG. 5 is a schematic projection of a pair of inductors, one within a feature layer and one within a via layer, coupled in series to each other and to a capacitor at the base of a via post within the via layer of the via inductor.

With reference to FIG. 5, a filter may be fabricated that includes a pair of inductors, a first inductor 60 within a feature layer and a second inductor 66 within a via layer, coupled in series to each other and to a capacitor 64 at the base of a via post 62 within the via layer of the via inductor 66.

It will be appreciated that for some filtering purposes, it is required to couple the components in parallel.

Figure 6:
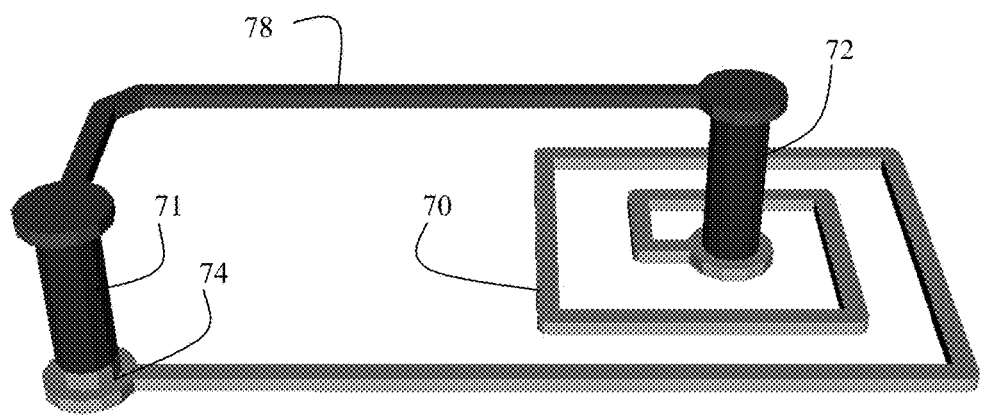
FIG. 6 is a schematic projection of an inductor in a feature layer, coupled in parallel with a capacitor, the capacitor and the inductor being coupled together by via posts and a trace in a second, upper feature layer or on the outside of the multilayer structure.

FIG. 6 is a schematic projection of an inductor 70 in a feature layer, coupled in parallel with a capacitor 74. The capacitor 74 and the inductor 70 are coupled together by via posts 71, 72 and a trace 78 in a second, upper feature layer or on the outside of the multilayer structure.

Figure 7:
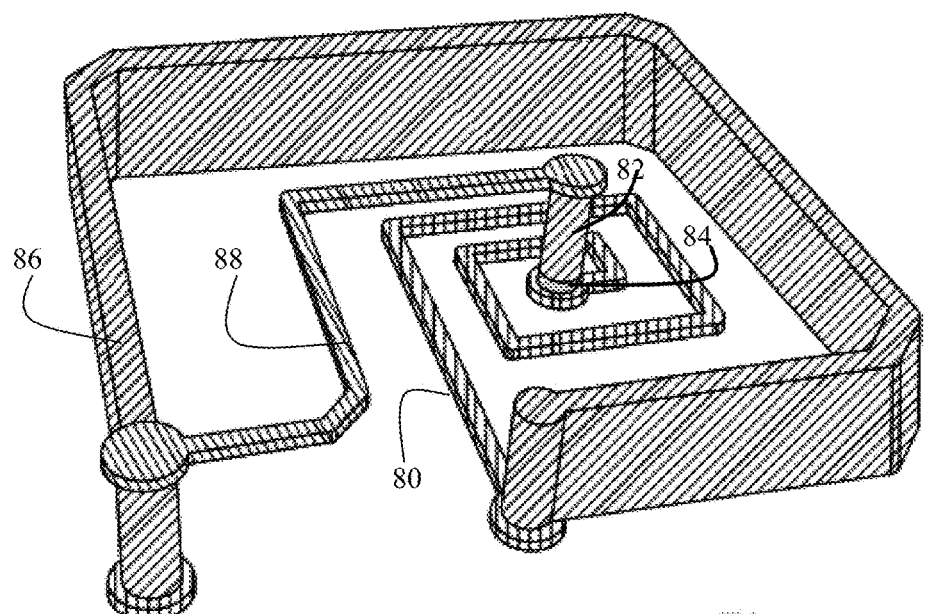
FIG. 7 is a schematic projection of an inductor in a feature layer, coupled in series with an inductive via, and in parallel with a capacitor, the capacitor and the inductive via being coupled together by a trace in a second, upper feature layer or on the outside of the multilayer structure.

FIG. 7 is a schematic projection of an inductor 80 in a feature layer, coupled in series with an inductive via 86, and in parallel with a capacitor 84, the capacitor 84 and the inductive via 86 being coupled together by a trace 88 in a second, (shown as upper) feature layer or on the outside of the multilayer structure.

Figure 8:
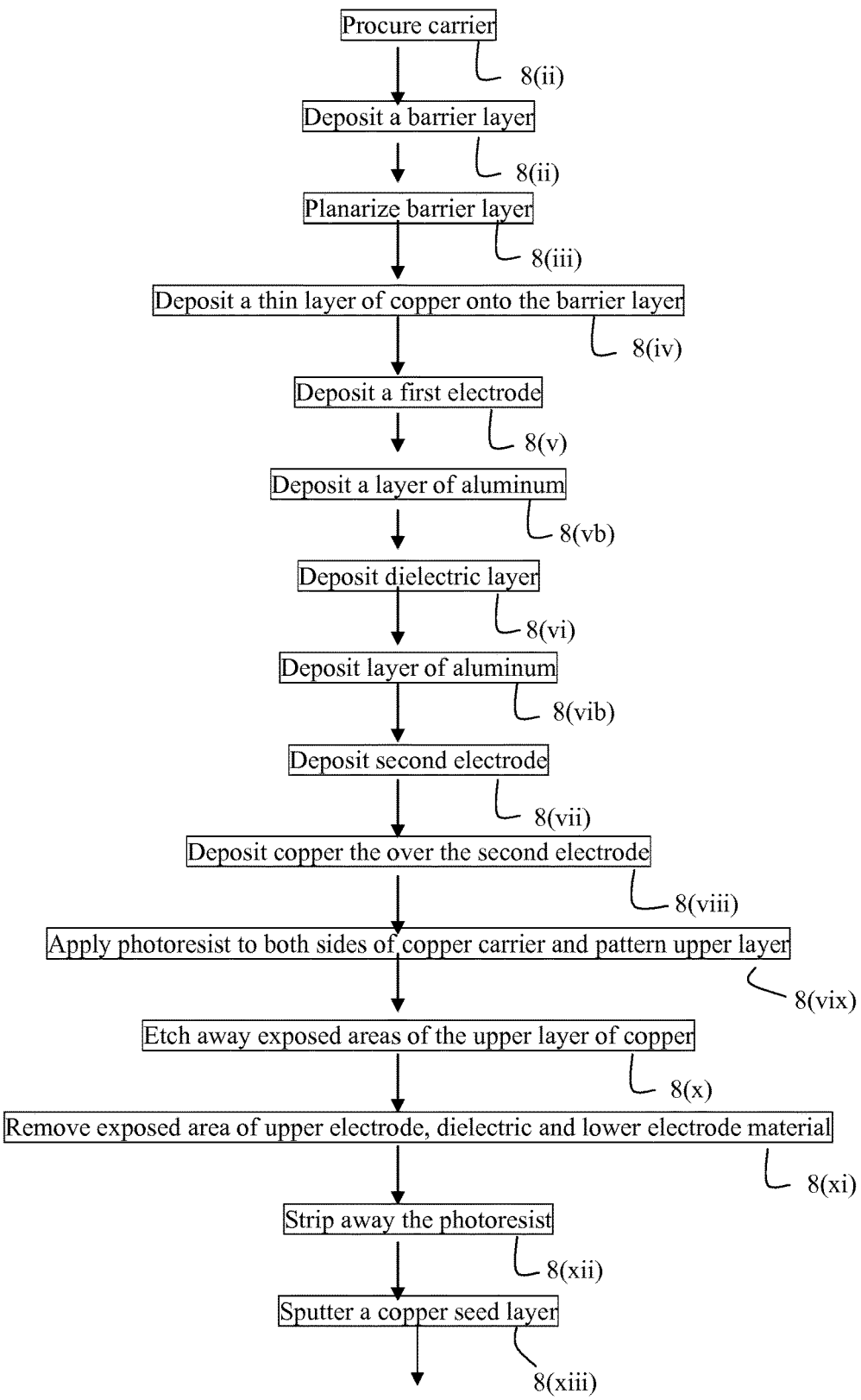
FIG. 8 is a flow chart illustrating a process for fabricating a substrate with an embedded filter consisting of a capacitor and inductors.
Figure 8:
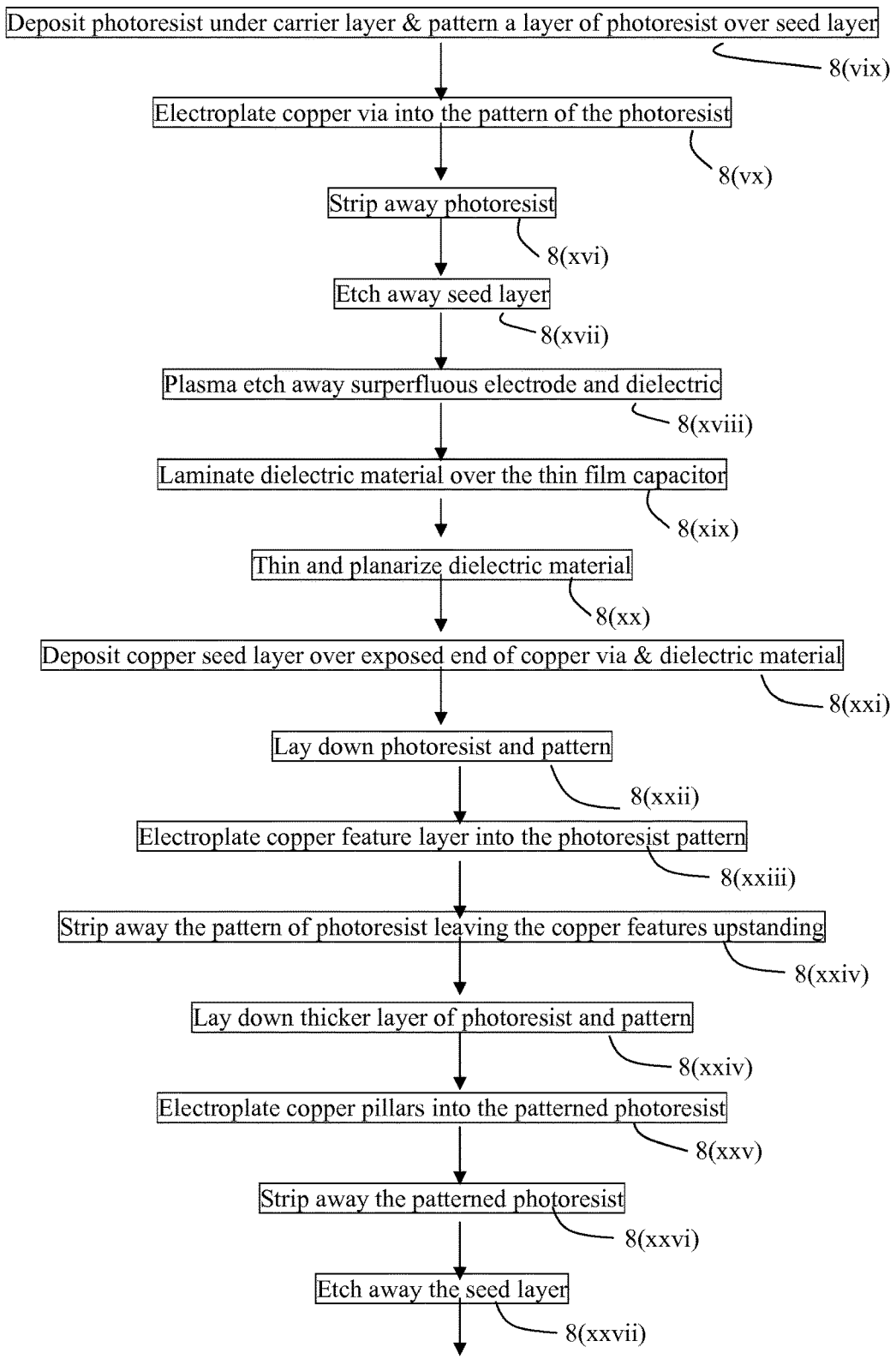
Figure 8:
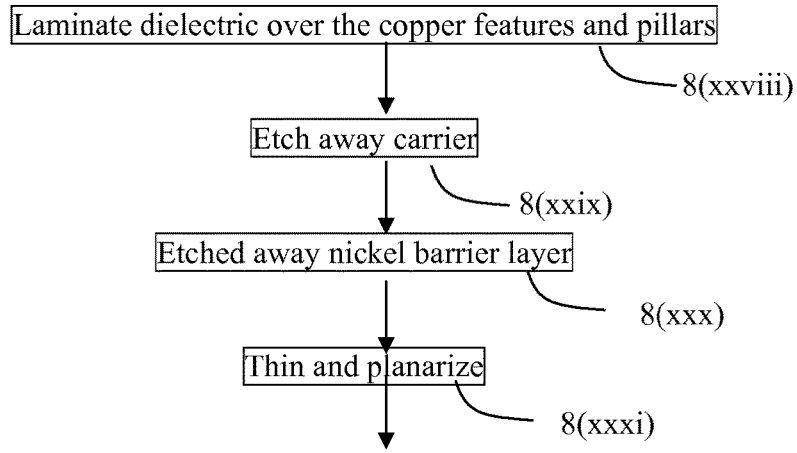

With reference to FIG. 8 and to FIGS. 8(*i*) to 8(*xx*), a method of fabricating a capacitor embedded in a dielectric is shown. The capacitor 248 shown in FIG. 8(*xx*) has dedicated electrodes of a different material, typically a noble metal such as gold, platinum or tantalum. Generally tantalum is used, as it cheaper than gold or platinum.

Firstly, a carrier 210 is procured—step 8(*i*). The carrier 210 is typically a sacrificial copper substrate. In some embodiments, it may be a copper carrier with a quick release thin film of copper appended thereto.

A barrier layer 212 is deposited onto the copper carrier 210—step 8(*ii*). The barrier metal layer 212 may be fabricated from Nickel, Gold, Tin, Lead, Palladium, Silver and combinations thereof. In some embodiments, the barrier metal layer has a thickness in a range of from 1 micron to 10 microns. Typically, the barrier layer 212 comprises nickel. A thin layer of nickel may be deposited by a physical vapor deposition process or by a chemical deposition process, and typically it is sputtered or electroplated onto the copper carrier. For fast processing, the barrier layer 212 may be electroplated. To ensure planarity and a smooth surface, it may then be planarized—step 8(*iii*) (FIG. 8(*iii*)), by chemical mechanical polishing (CMP) for example.

A thin layer of copper 214 is now deposited onto the barrier layer 212—step 8(*iv*). The thickness of the copper layer 214 is typically several microns and may be fabricated by sputtering or by electroplating.

A first electrode 216 is now deposited—step 8(*v*). By way of example, first electrode 216 may be fabricated from tantalum by sputtering.

A dielectric layer 218 is now deposited—step 8(*vi*). For high performance capacitors, the dielectric layer 218 must be kept as thin as possible, without risking faults that enable charge leakage. There are various candidate materials that may be used. These include $Ta_2O_5$, $BaO_4SrTi$, and $TiO_2$, which may be deposited by sputtering, for example. Typically the thickness of the dielectric layer 218 is in the range of 0.1 to 0.3 microns.

A second electrode 220 may now be deposited step 8(*vii*). By way of example, second electrode 220 may be fabricated from tantalum by sputtering.

In a variant process, a second noble electrode 220 is not applied. Rather, a copper via is deposited directly onto the dielectric, its footprint defining the upper electrode and thus the effective area and capacitance of the capacitor.

Furthermore, it is difficult to fabricate thin dielectric layers of $Ta_2O_5$, $BaO_4SrTi$, or $TiO_2$ without defects that may result in charge leakage. To overcome this problem, in some embodiments an aluminium layer (not shown) is deposited before or after depositing the $Ta_2O_5$, $BaO_4SrTi$, or $TiO_2$ layer, and by exposure to heat in an oxygen environment, the aluminium layer is oxidized into the high dielectric ceramic alumina ($Al_2O_3$). In this manner, it is possible to cure defects and to ensure that a continuous thin dielectric separates the electrodes.

In the main process, a further layer of copper 222 is deposited over the second electrode 220—step 8(*viii*). Further layer of copper 222 may be deposited by sputtering or by electroplating, for example. The upper copper layer 222 may be patterned using photoresists to pattern plate or by printing and etching to fabricate pads, conductors and inductors, for example. A layer of photoresist 208 may be applied beneath the copper carrier 210, and a second layer of photoresist 224 is applied over the further layer of copper 222 and developed into a pattern—step 8(*ix*).

Areas of the further layer of copper 222 that are not protected by the patterned photoresist 224 are etched away—step 8(*x*). A wet etch may be used. By way of example, one way of etching away the areas of the further layer of copper 222 not protected by the patterned photoresist 224 consists of exposing the sacrificial substrate to a solution of ammonium hydroxide at an elevated temperature. Alternatively copper chloride or a wet Ferric Chloride etch may be used.

The exposed electrode layers 216, 220 and dielectric layer 218 may be removed by dry etching using a plasma etching process—step 8(*xi*). For example hydrogen fluouride and oxygen may be used to etch $TiO_2$ or $Ta_2O_5$ and hydrogen fluoride and Argon to etch $BaO_4SrTi$ (BST). Typical concentration ratios for $CF_4:O_2$ are in the range of between 50:50 to 95:5 where 95 is for the $CF_4$. Typical concentration ratios for $CF_4:Ar$ can be any ratio between 50:50 to 95:5 where 95 if for Ar.

In a variant method, as described hereinabove, no upper electrode 220 is deposited. Rather a copper via is fabricated directly onto the dielectric material. Patterning a photoresist, either with a stencil or with a laser, enables accurate control of the cross-sectional size and shape of the via, which serves as the upper electrode and defines the capacitance of the capacitor, since the capacitance is proportional to the effective area of the via electrode.

In the main process, the patterned photoresist 224 is now stripped away—step 8(*xii*) as is generally, the second layer of photoresist 208, which is shortly replaced with a similar layer of photoresist 228—so could be retained.

A seed layer of copper is deposited 226 over and around the capacitor and exposed copper layer 214. To help adhesion, a first seed layer of titanium may be first deposited—step 8(*xiii*) FIG. 8(*xiii*).

Now moving to a different scale for FIG. 8(*xiv*) onwards, a further layer of photoresist 228 is applied to protect the copper substrate (assuming that layer 208 was removed), and a thick layer of photoresist 230 is deposited and patterned over the seed layer 226. Copper interconnects 232 are electroplated into the pattern created by the photoresist 230—step 8(*xv*).

The photoresist 228 (208), 230 is now stripped away, leaving the capacitor 248 shorted by seed layer 226, and the copper via post 232 interconnect, exposed—step 8(*xvi*).

The seed layer 226 is etched away—step 8(*xvii*), with a quick etch to do minimal damage to the copper layer 214 and the via 232, but to ensure that the copper layer 214 and the copper via 232 are isolated from each other by the capacitor. A layer of a polymer based dielectric material 234 is now laminated over the copper substrate and via—step 8(*xviii*).

The polymer based dielectric material 234 is typically a polyimide, epoxy or BT (Bismaleimide/Triazine) or their blends, and may be reinforced with glass fibers. In some embodiments, a prepreg consisting of woven fiber mats in a polymer resin may be used. The polymer matrix may include inorganic particulate fillers that typically have a mean particle size of between 0.5 microns and 30 microns and the polymer typically includes between 15% and 30% of particulate by weight.

Although sometimes referred to as a being a dielectric, the polymer based dielectric material 234 has a lower dielectric constant than that of the dielectric layer 218, which is typically a more exotic material such as $Ta_2O_5$ or $BaO_4SrTi$ or $TiO_2$.

The cured polymer based dielectric material 234 is then thinned and planarized, by chemical mechanical polishing (CMP) for example, thereby exposing the end of the copper via 232—step 8(xix). A further seed layer of copper 236 is then deposited over the polymer based dielectric material 234 and the end of the copper vias 232—step 8(xx). A layer of photoresist 238 is deposited over the seed layer 236 and the layer of photoresist 238 is patterned—step 8(xxi). A feature layer of copper 240 is then electroplated into the pattern—step 8(xxii).

The photoresist 238 may now be stripped away—Step 8(xxiii).

At this stage, the lower copper layer 214 is coupled by the copper interconnect 232 to the upper copper layer 240, via a capacitor 248 embedded in the copper interconnect 232.

A further layer of photoresist 242 may be deposited and patterned—step 8(xxiv), and copper vias 244 may be electroplated into the pattern—step 8(xxv).

The photoresist 242 may be stripped away leaving the upstanding copper vias 244—step 8(xxvi), and the copper seed layer 236 is etched away—step 8(xvii). This may be removed by a dry plasma etch, or by a short etch with copper chloride or with ammonium chloride solution.

The present invention is capable of many variations, with reference to FIG. 8(xviii), prior to laminating the polymer based dielectric material 234 over the copper substrate and via, the structure is plasma etched with a plasma etch that copper is resistant to, but which tantalum and titanium oxide are susceptible to, such as a mix of hydrogen fluoride and oxygen.—step 10(xviii). This reduces the dimensions of the capacitor to that of the via post 232. Since the via post 232 is fabricated by electroplating into a photoresist, this provides the possibility of fabricating to virtually any size and shape with high accuracy, and may be square or rectangular, instead of round, to enable high packing density. Removing the excess capacitor material enables high packing density between components. Capacitor 348 or capacitor 248 is then embedded in a polymer based dielectric material 234 that is typically a polyimide, epoxy or BT (Bismaleimide/Triazine) or their blends, and may be reinforced with glass fibers—10(xix). In some embodiments, a prepreg consisting of woven fiber mats in a polymer resin may be used for the encapsulation. The polymer matrix 234 may include inorganic particulate fillers that typically have a mean particle size of between 0.5 microns and 30 microns and the polymer typically includes between 15% and 30% of particulate by weight.

With reference to FIG. 8(xx) the dielectric material 232 may be thinned and planarized, exposing the end of the copper via 232, and a copper seed layer 236 may be deposited thereover—step(xxi). Photoresist 238 may be deposited and patterned—step(xxii) and a copper feature layer 240 may be deposited into the pattern—step(xxiii).

The pattern of photoresist 238 may be stripped away leaving the feature layer 240 upstanding—step (xxiv), and a further layer of vias 244 may be built up by laying down and patterning a thicker layer of photoresist 242—step 8(xxiv), and then pattern plating copper vias 244 into the patterned photoresist 238—step 8(xxv).

The copper carrier 212 may also be etched away, typically using a copper chloride or ammonium chloride solution for so doing—step 8(xxvi), the (typically nickel) barrier layer 212 serving as an etch stop.

The barrier layer 214 may then be removed with an appropriate etching technique, such as plasma etching, or with a specific chemical etchant—step 8(xxvii). For example, to etch away nickel without removing copper, a mixture of nitric acid hydrogen peroxide may be used. Possible alternatives that dissolve nickel include hydrochloric acid+hydrogen peroxide, hot concentrated sulfuric acid and iron(III) chloride acidified with hydrochloric acid.

The polymer layer 246 is then thinned and planarized—step 8(xxviii), to expose the ends of the copper vias 244. Grinding, polishing or a combined chemical mechanical polishing (CMP) may be used.

Thus far, we've shown how an advanced, high performance capacitor 248 may be embedded into a composite structure 250 comprising copper feature layers 216, 240 and copper vias 232, 244, embedded in a polymer based dielectric matrix 234, 246.

Since the in-plane shape of the capacitor plates and dielectrics are determined by patterning photoresist, it will be appreciated that the capacitor may take substantially any shape, and typically will be square or rectangular, but may be circular, or indeed may have practically any other shape. The capacitor may have one, two, three or more layers. The thickness of the dielectric may be carefully controlled, so it is possible to tailor capacitors of the invention to have substantially any capacitance over a large range, and it is possible to accurately control the capacitance, optimizing it for particular operating frequencies.

It will also be noted that via 244 is not restricted to being a simple cylindrical via post, since it is not fabricated by the drill & fill technology. By fabricating using electroplating into a pattern within a photoresist 242, via 244 may also have substantially any shape and size. Since via 244 may be an extensive wire within the via layer, via 244 may be an inductor and is preferably a high Q inductor having an inductance ranging from about 0.1 nH to about 10 nH. It should be also noted that such an "inductor via" may be combined with an inductor structure from the feature layers 214, 240 and/or 260, 262, shown hereinbelow, with reference to FIG. 8(xxxv), etc. The combination of a capacitor 248 and an inductor 244 enables the provision of an RF filter.

With reference to—steps 9(xxxiii) to steps 9(xL), a technology for fabricating the ports of a filter is described.

With reference to step 9(xxxiii), a titanium seed layer 252 is now sputtered over the matrix 246 and the exposed ends of the copper (inductor) vias 244. Referring to step 6(xxxiv), a copper layer 254 is now sputtered over the titanium layer 252.

With reference to step 9(xxxv), layers of photoresist 256, 258 are laid down and patterned on each side of the composite structure 250. Referring to step 9(xxxvi), copper 260, 262 is electroplated into the patterned photoresist 256, 258 to create ports.

With reference to step 9(xxxvii), the layers of photoresist 256, 258 are now stripped away leaving the copper upstanding. With reference to step 9(xxxviii), the titanium and copper layers are etched away. Copper pads 260, 262 will be slightly damaged in this process.

The hollows thus formed may be filled with solder mask 264—step 9(xxxix), and the copper protected with ENEPIG 266—step 9(xL) or other appropriate termination technology.

Figure 9:
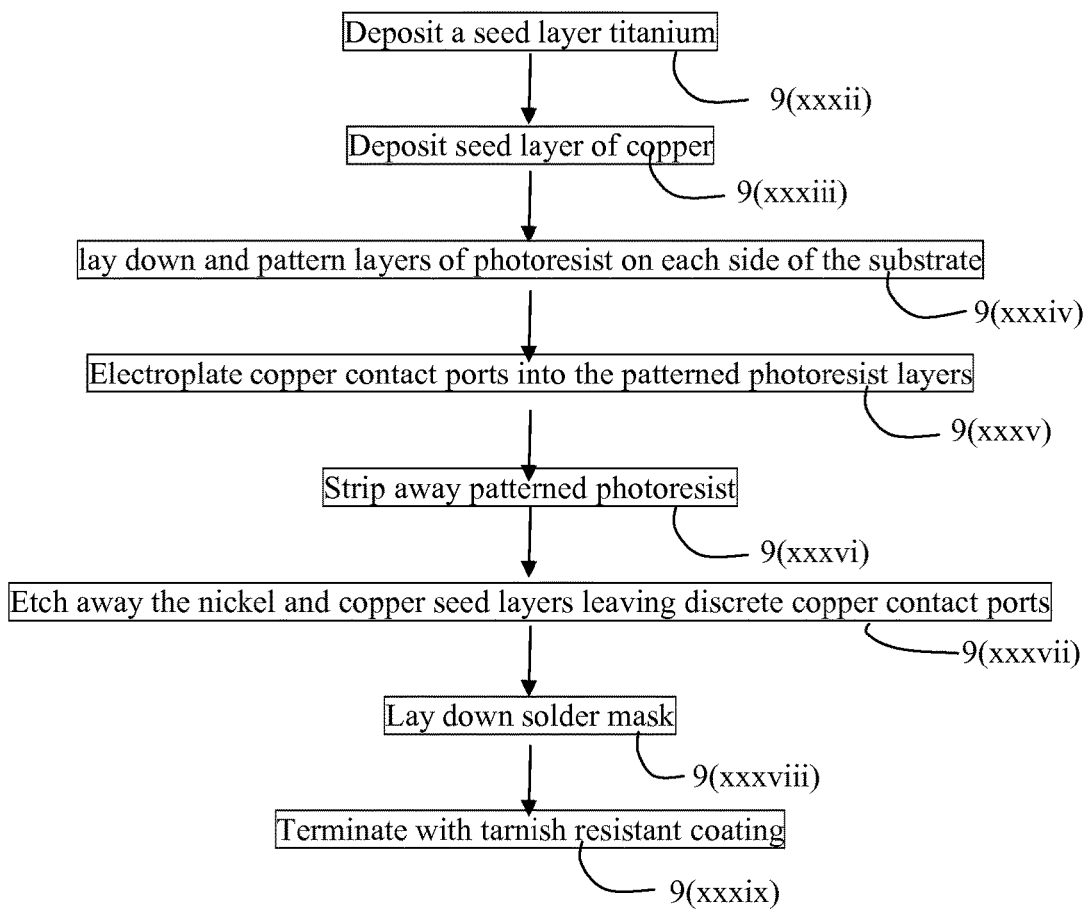
FIG. 9 is a flow chart illustrating a process for terminating the filter of FIG. 8.
Figures 10A, 10B:
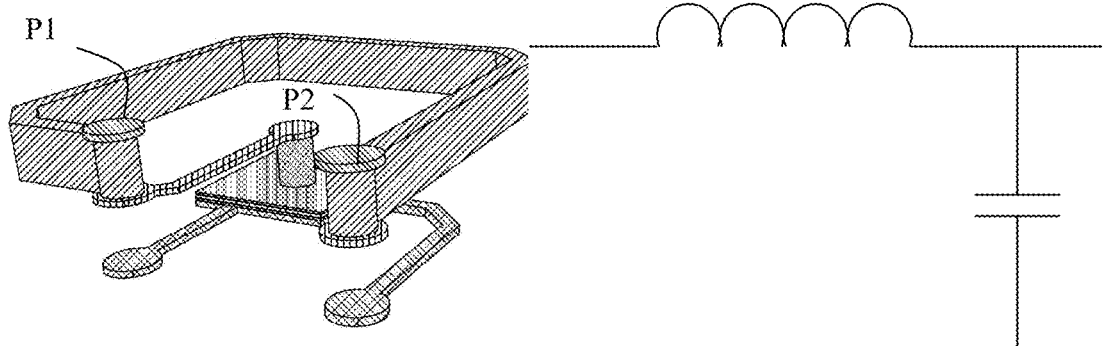
FIG. 10a is a schematic three dimensional view of a basic LC low pass filter.
FIG. 10b shows how the basic LC low pass filter of FIG. 11a may be represented as an LC filter circuit.
Figure 10C:
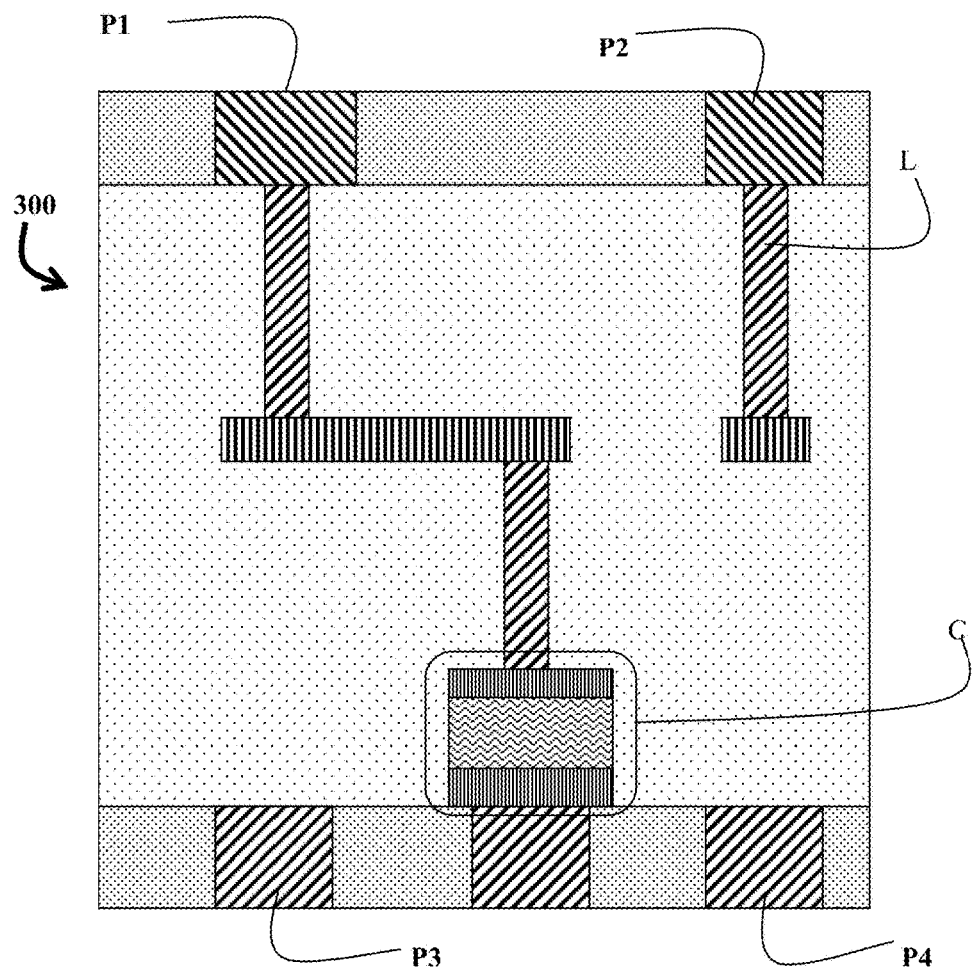

With reference to FIG. 10a, which is a three dimensional representation shows the structure of FIG. 9(xL), to FIG. 10b which is an equivalent circuit diagram, and to FIG. 10c, which is essentially the structure of FIG. 9(xL), it will be appreciated that the structure thus created is essentially a basic LC low pass filter 300 consisting of four ports, P1, P2, P3, P4, a capacitor C and an inductor L.

Figure 10D:
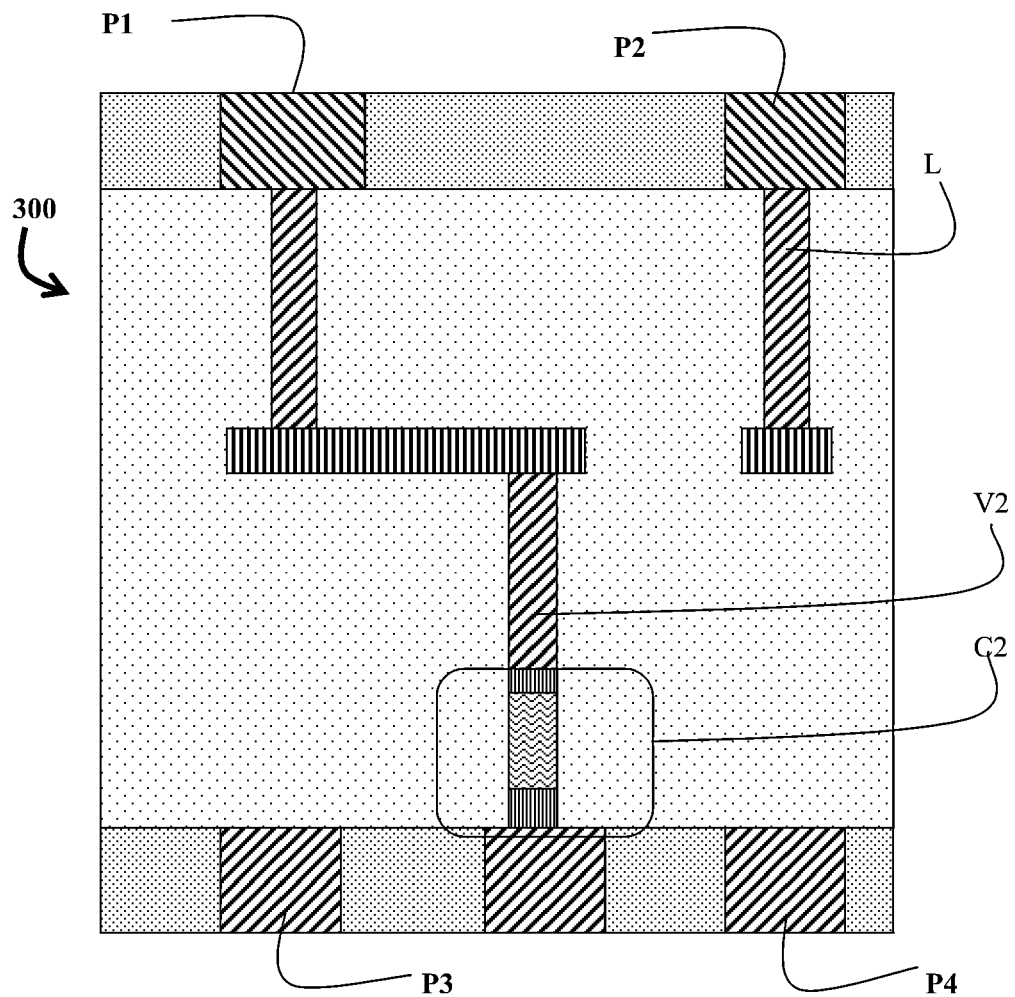
FIG. 10d is a schematic cross section of the basic LC low pass filter of FIG. 10a wherein the capacitor is sized to the via pillar thereover, which defines the effective capacitance of the capacitor.

Referring to FIG. 10d, in a variant manufacturing technique using the plasma etching step shown in FIG. 10(xxxiii), the footprint of via V2 defines the capacitance and the size of the capacitor C2, where excess material is etched away with a plasma etch. Thus 10d is a schematic cross section of a basic LC low pass filter equivalent to FIG. 10a wherein the top the via pillar V2 defines the size of the electrodes and dielectric layer of the capacitor, as in the structures of FIGS. 2 to 7.

Figure 10E:
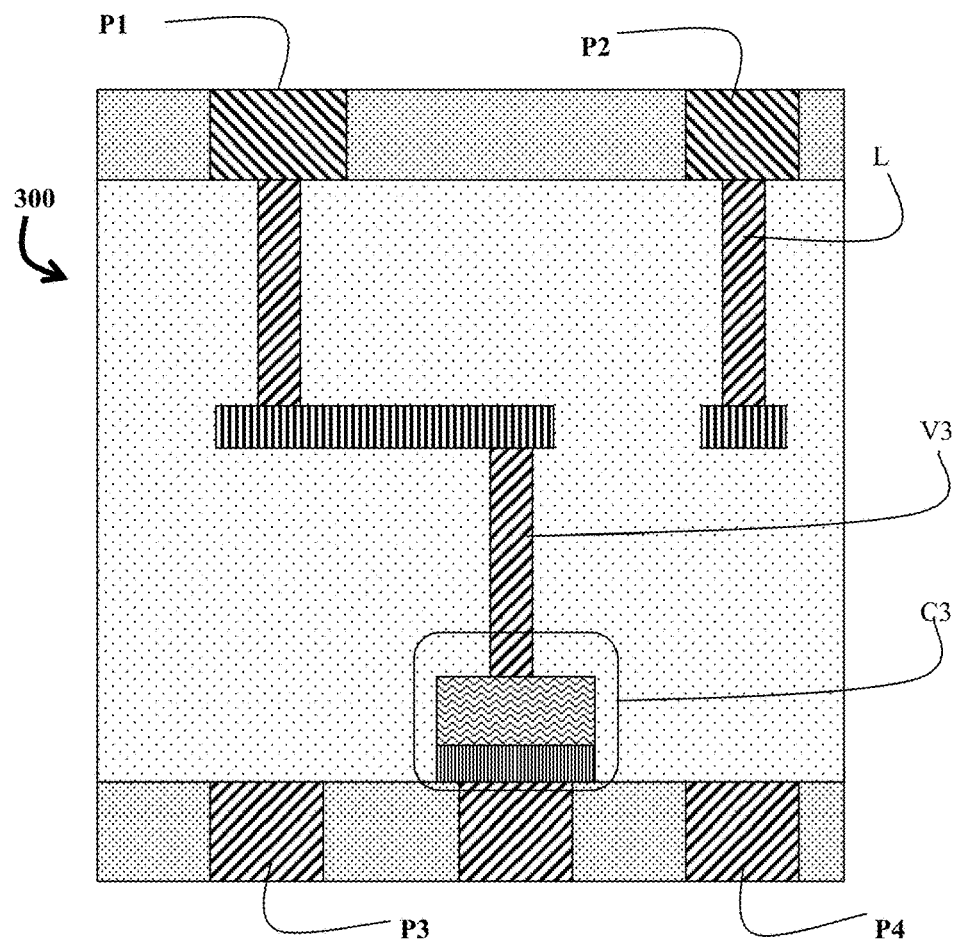
FIG. 10e is a schematic cross section of the basic LC low pass filter of FIG. 10a wherein the top electrode is the via pillar thereover.

FIG. 10e is a schematic cross section of yet another basic LC low pass filter of FIG. 10a wherein the top electrode of the capacitor C3 is the via pillar V3 without depositing an upper electrode of noble metal. Here care must be taken to remove all of the copper seed layer from the dielectric.

Figure 8I:
Figure 8:
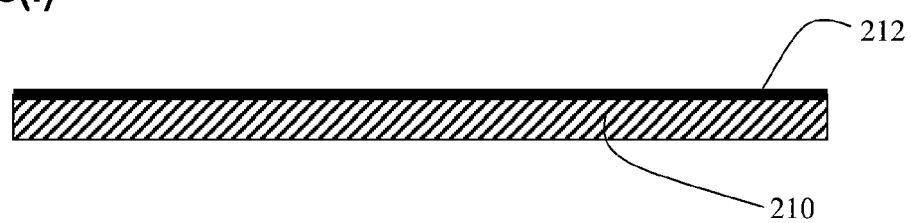
Figure 8:
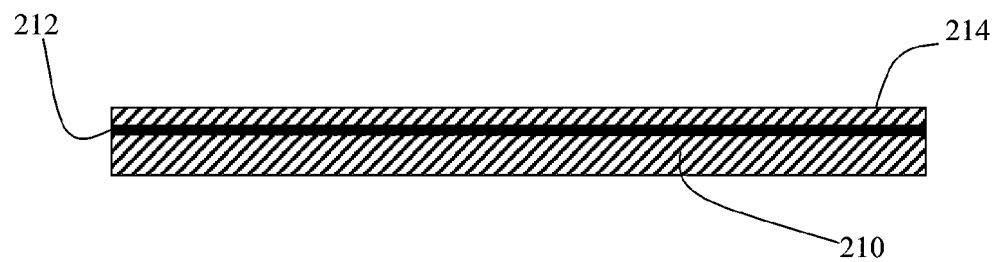
Figure 8V:
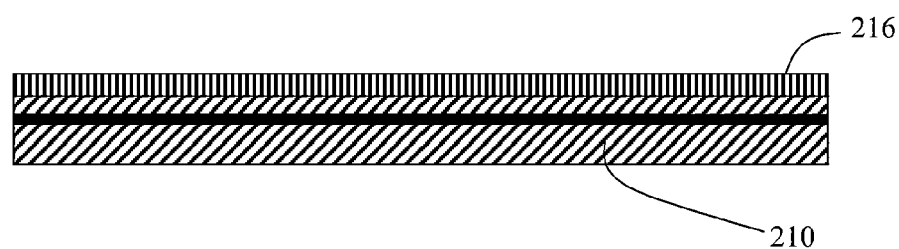
Figure 8:
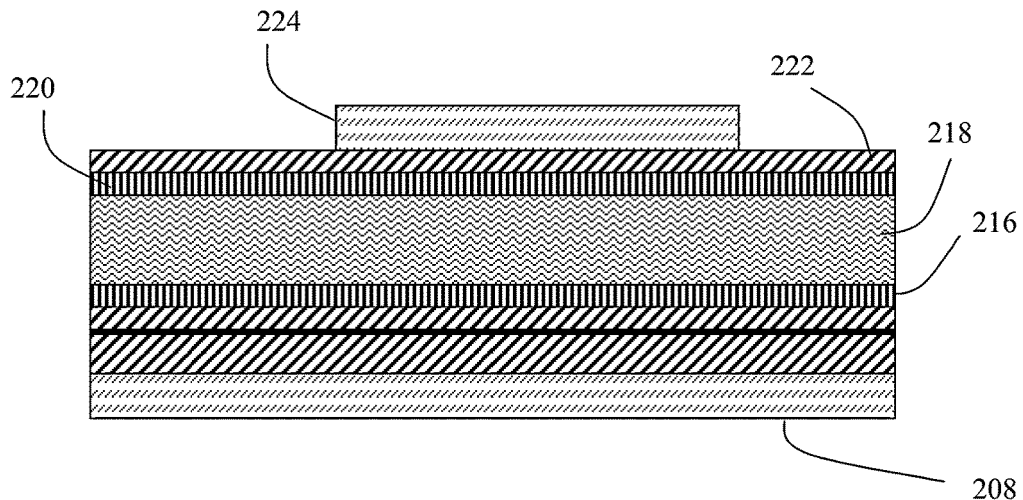
Figure 8X:
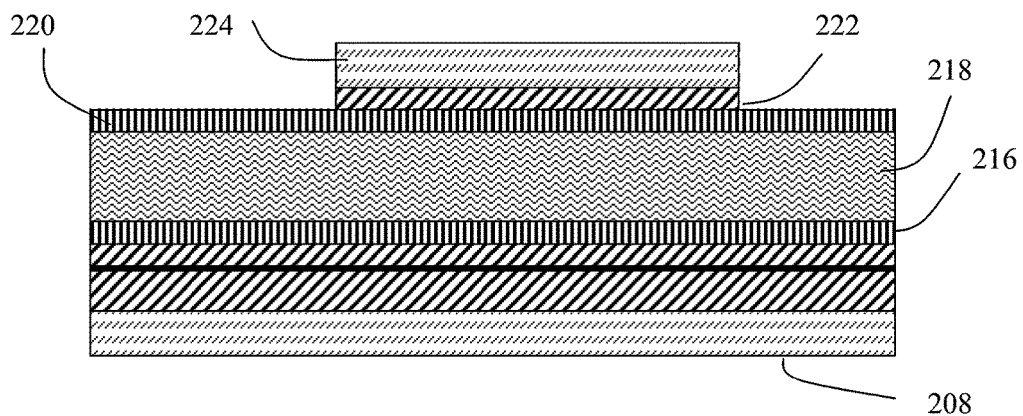
Figure 8:
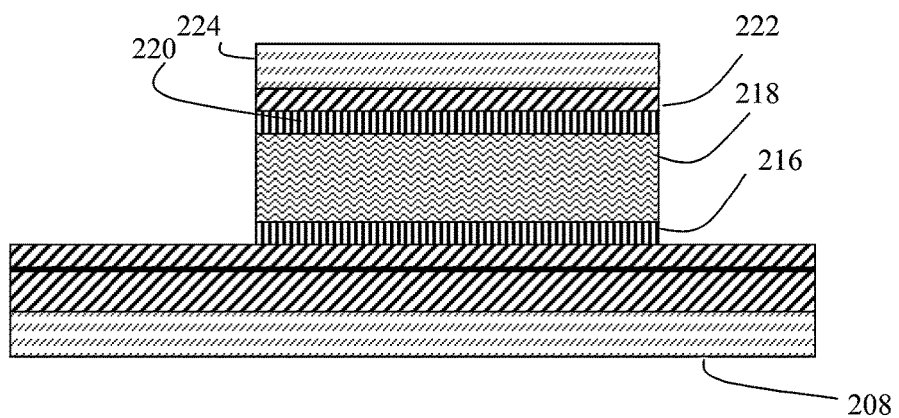
Figure 8:
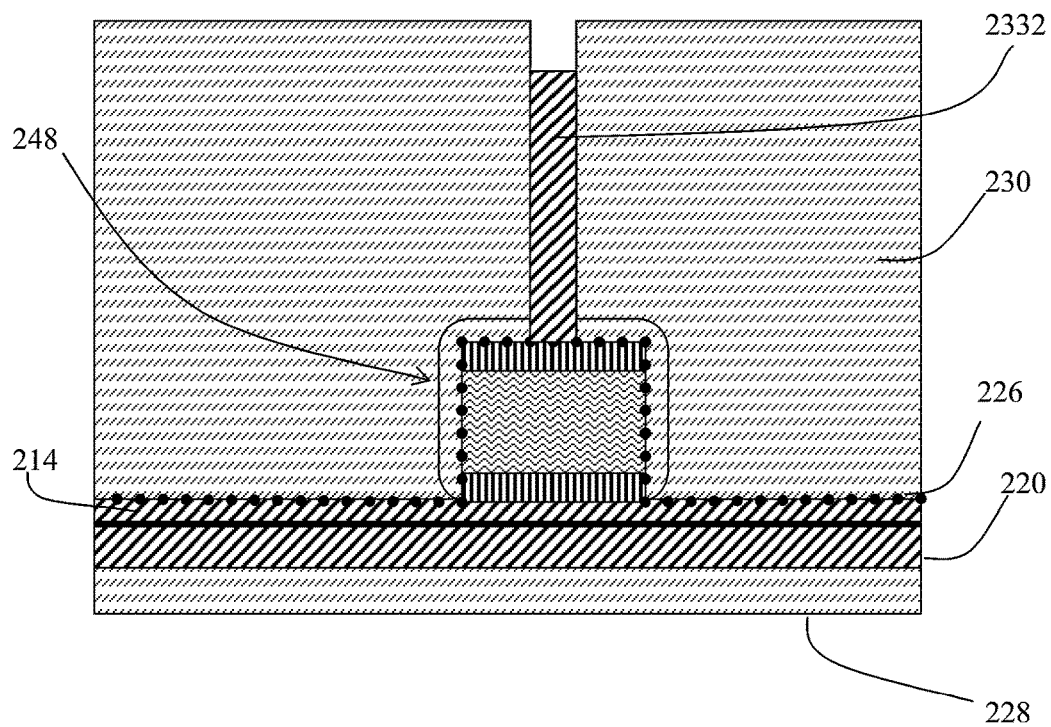
Figure 8:
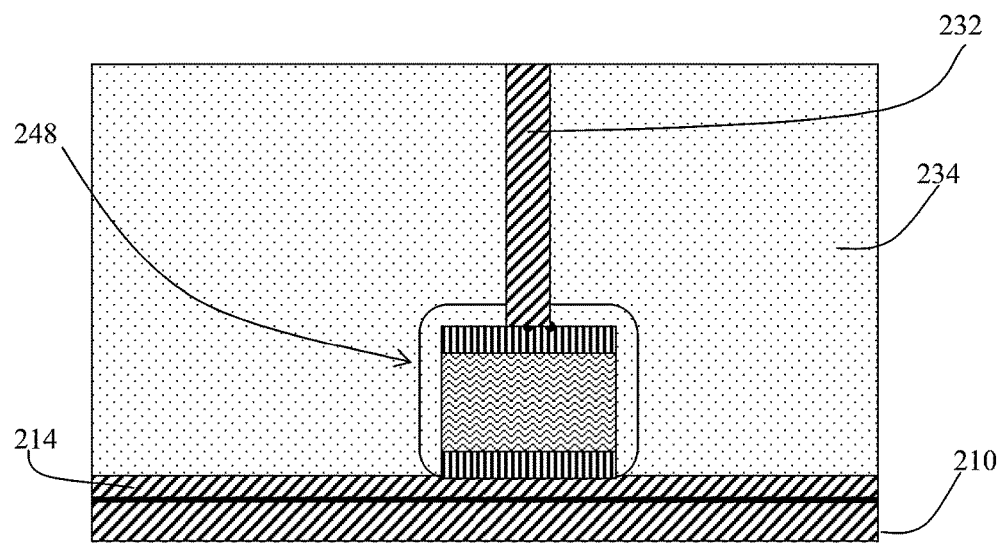
Figure 9:
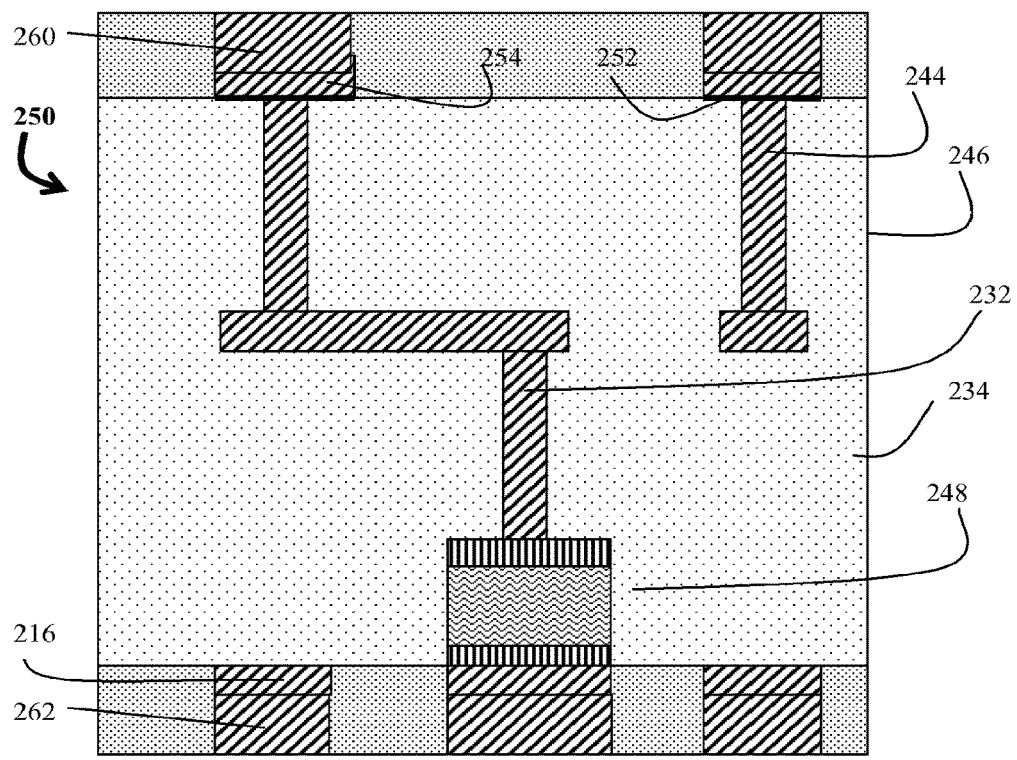
Figure 9:
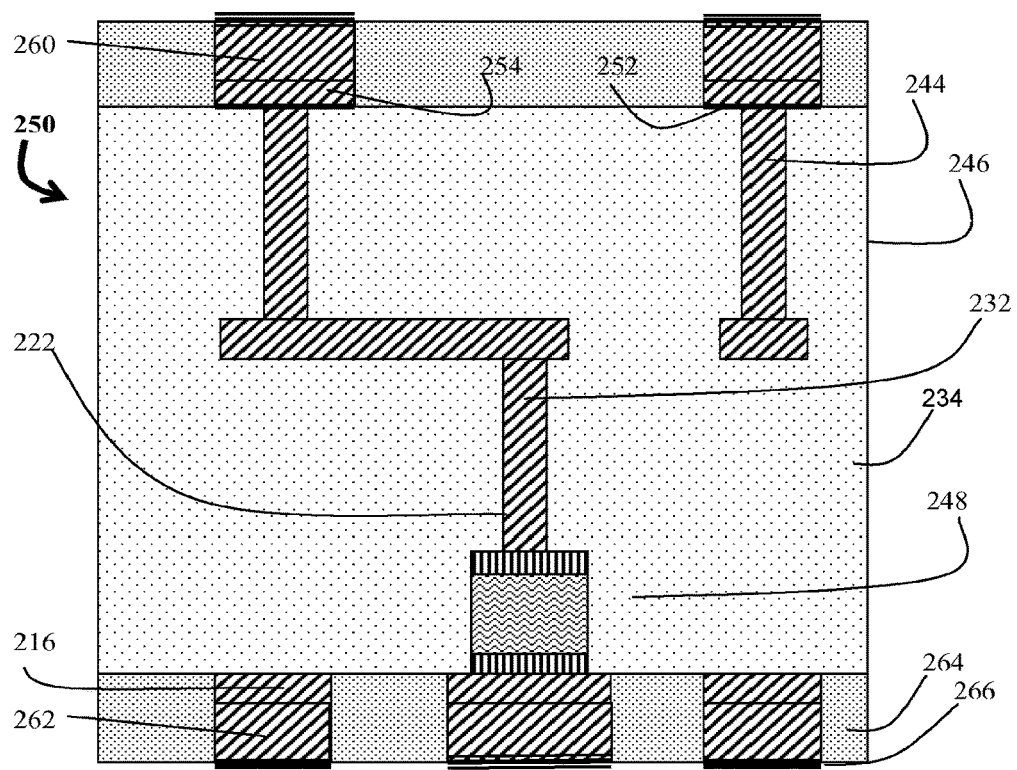
Figure 11A:
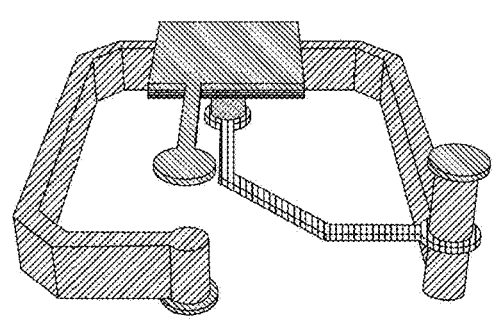
FIG. 11a is a schematic three dimensional view of a basic LC high pass filter.
Figure 11B:
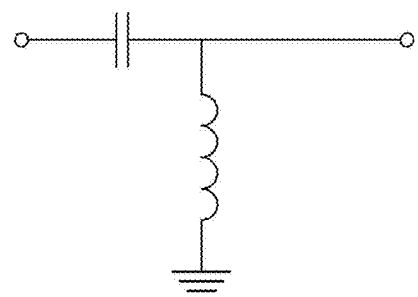
FIG. 11b shows how the basic LC high pass filter of FIG. 11a may be represented as an LC filter circuit component.
Figure 12A:
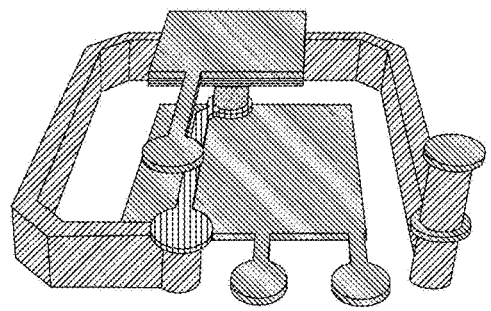
FIG. 12a is a schematic three dimensional view of a basic LC band pass series filter.
Figure 12B:
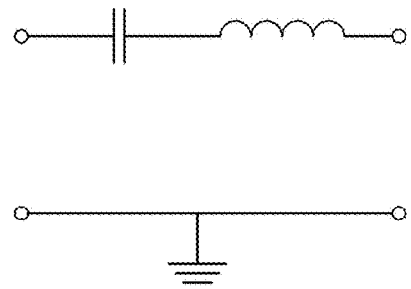
FIG. 12b shows how the basic LC band pass series filter of FIG. 12a may be represented as an LC filter circuit component.
Figure 13A:
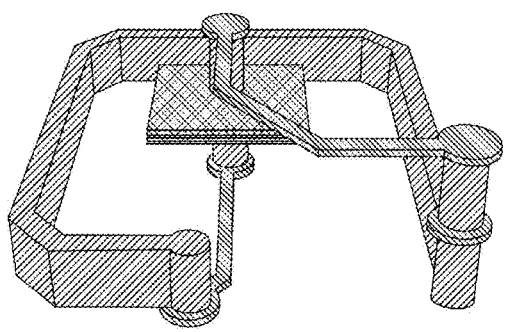
FIG. 13a is a schematic three dimensional view of basic LC band pass parallel filter comprising a capacitor and inductors.
Figure 13B:
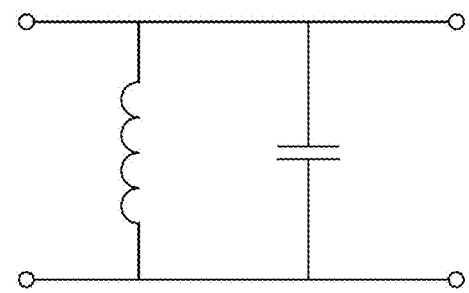
FIG. 13b shows how the basic LC band pass parallel filter of FIG. 13a may be represented as an LC filter circuit component.
Figure 14A:
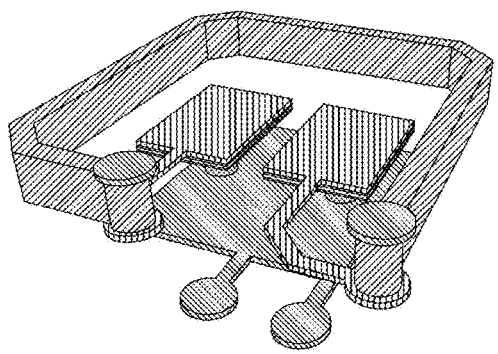
FIG. 14a is a schematic three dimensional view of a Low Pass Parallel-Chebyshev Filter.
Figure 14B:
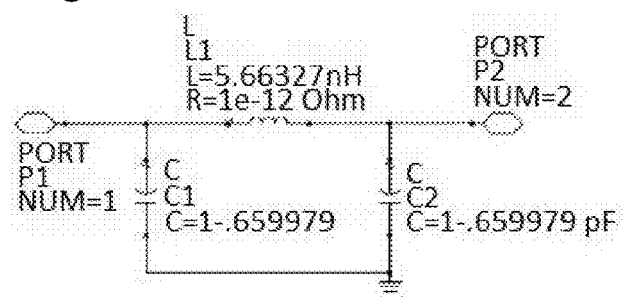
FIG. 14b shows how the Low Pass Parallel-Chebyshev Filter may be represented as an LC filter.

It will be appreciated that the technology detailed in FIG. 8 and FIGS. 8(i) to FIG. 8(xxxii) and FIG. 9(xxxiii) to FIG. 9(xL) can be used to create a very wide range of filters circuits with different characteristics. For example, with reference to FIGS. 11a and 11b a basic LC high pass filter may be fabricated. With reference to FIGS. 12a and 12b, a basic LC series band pass filter may be fabricated, as, with reference to FIGS. 13a and 13b, a basic LC parallel band pass filter may be fabricated. With reference to FIGS. 14a and 14b, with appropriate variations, mutatis mutandis, a Low Pass Parallel-Chebyshev filter can be fabricated.

Although single filters have been illustrated, it will be appreciated that in practice, vast arrays of such filters are cofabricated in large plates that may then be singulated. Other components may be cofabricated together with the filters. The filter 260 may be surface mounted on a substrate or embedded into a substrate by depositing further feature and via layers there-around.

In general, there is an inherent disadvantage with embedded components, in that if something goes wrong, the component and the structure into which it is embedded must be discarded. Sometimes, diagnosing the route cause of a problem may be difficult where a component cannot be isolated and tested individually. However, due to demands for the expensive (real estate) on the surface of the substrate and a general trend towards miniaturization, there are significant advantages in embedding filters and other passive components.

It is a feature of the present invention, that filters and other passive components may be fabricated as stand alone products for surface mounting, but may be optimized and then the processing may be integrated into the fabrication processing of the substrate to embed such components.

The capacitances of capacitors formed depend on the electrode plate area, the thickness of the dielectric and its dielectric constant. Typically, capacitors for RF filters have capacitances of between about 5 and about 15 pF. It is possible to control the capacitance to a narrow range, such as between 9 and 12 pF, and even to between 10 and 11 pF.

Inductors of the invention may have inductances in the range of nano-Henrys. Say from 0.2 nH to 300 nH, but typically, from 1 nH to about 10 nH.

It is possible to control the inductances of these inductors to narrow ranges, such as has to the range of from about 4 nH to about 8 nH, or even, where required to a range of less than one nano Henry, say between about 5 nH and about 6 nH.

The above description is provided by way of explanation only. It will be appreciated that the present invention is capable of many variations.

Several embodiments of the present invention have been described. Nevertheless, it will be understood that various modifications may be made without departing from the spirit and scope of the invention. Accordingly, other embodiments are within the scope of the following claims.

Thus persons skilled in the art will appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components.

What is claimed is:

1. A composite electronic structure for coupling an IC Chip to a substrate, the composite electronic structure comprising:
   at least one metal feature layer and at least one adjacent metal via layer, said layers embedded in a dielectric comprising a polymer matrix and extending in an X-Y plane and having height z,
   wherein the composite electronic structure further comprises:
   at least one capacitor coupled with at least one inductor, the at least one capacitor comprising:
      a selected feature layer forming a lower electrode; and
      a ceramic dielectric layer, the at least one capacitor disposed at a base of a via post in one of said at least one via layers such that the ceramic dielectric layer is sandwiched between the selected feature layer and the via post, such that the via post stands on the ceramic dielectric layer, and forms an upper electrode,
   and
   wherein the at least one inductor is formed in at least one of the at least one feature layer and the adjacent via layer.

2. The composite electronic structure of claim 1, wherein the at least one capacitor and the at least one inductor are coupled in series.

3. The composite electronic structure of claim 1, comprising at least a second feature layer over the via layer and wherein the at least one capacitor and the at least one inductor are coupled in parallel via the feature layer.

4. The composite electronic structure of claim 1, wherein the at least one inductor is fabricated in the feature layer.

5. The multilayer composite electronic structure of claim 4, wherein the at least one inductor is spirally coiled.

6. The multilayer composite electronic structure of claim 4 wherein the inductance of the inductor is at least 0.1 nH.

7. The multilayer composite electronic structure of claim 4 wherein the inductance of the inductor is less than 50 nH.

8. The multilayer composite electronic structure of claim 4, wherein a further inductor is fabricated in a via layer.

9. The multilayer composite electronic structure of claim 1, wherein the at least one inductor is fabricated in a via layer.

10. The multilayer composite electronic structure of claim 9 wherein the inductance of the inductor is at least 0.1 nH.

11. The multilayer composite electronic structure of claim 9 wherein the inductance of the inductor is less than 10 nH.

12. The multilayer composite electronic structure of claim 1, wherein said at least one inductor and said at least one capacitor provide a filter, said filter being selected from the group consisting of basic LC low pass filters, LC high pass filters, LC series band pass filters, LC parallel band pass filters and Low Pass Parallel—Chebyshev filters.

13. The multilayer composite electronic structure of claim 1, wherein the polymer matrix further comprises glass fibers.

14. The multilayer composite electronic structure of claim 1, wherein the polymer matrix comprises a polymer selected from the group comprising polyimides, epoxies, BT (Bis-maleimide/Triazine) and their blends.

15. The multilayer composite electronic structure of claim 1, wherein the polymer matrix further comprises inorganic particulate fillers having mean particle size of between 0.5 microns and 30 microns and between 15% and 30% of particulate by weight.

16. The multilayer composite electronic structure of claim 1, wherein the dielectric of the capacitor comprises at least one of the group consisting of $Ta_2O5$, $TiO_2$ and $BaO_4SrTi$ and optionally further comprising $Al_2O_3$.

17. The multilayer composite electronic structure of claim 1, wherein the lower electrode comprising a noble metal.

18. The multilayer composite electronic structure of claim 17, wherein the lower electrode comprises a metal selected from the group consisting of gold, platinum and tantalum.

19. The multilayer composite electronic structure of claim 17, wherein the upper electrode comprises a metal selected from the group consisting of gold, platinum and tantalum.

20. The multilayer composite electronic structure of claim 17, wherein the upper electrode comprises the via post.

21. The multilayer composite electronic structure of claim 1 wherein the capacitor has a cross sectional area defined by a cross sectional area of the via post, that is carefully controlled to tune capacitance of capacitor.

22. The multilayer composite electronic structure of claim 1, wherein the at least one capacitor has a capacitance of between 1.5 pF and 300 pF.

23. The multilayer composite electronic structure of claim 1, wherein the at least one capacitor has a capacitance of between 5 and 15 pF.

24. A method of fabricating filters in an array, comprising fabricating capacitors by depositing a first electrode and a layer of ceramic and applying a via post over part of the layer of ceramic such that size of footprint of the via post on the layer of ceramic defines controls capacitance of the capacitor, and fabricating inductors by electroplating copper into a pattern of photoresist, stripping away the photoresist and laminating.

* * * * *